US006438729B1

(12) United States Patent
Ho

(10) Patent No.: US 6,438,729 B1
(45) Date of Patent: *Aug. 20, 2002

(54) CONNECTIVITY-BASED APPROACH FOR EXTRACTING LAYOUT PARASITICS

(75) Inventor: William Wai Yan Ho, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/315,773

(22) Filed: May 20, 1999

Related U.S. Application Data

(63) Continuation of application No. 09/012,603, filed on Jan. 23, 1998, now Pat. No. 5,999,726, which is a continuation of application No. 08/895,098, filed on Jul. 16, 1997, now Pat. No. 6,128,768, which is a continuation of application No. 08/468,034, filed on Jun. 6, 1995, now Pat. No. 5,903,469, which is a continuation-in-part of application No. 08/335,592, filed on Nov. 8, 1994, now Pat. No. 5,828,580.

(51) Int. Cl.$^7$ .............................................. G06F 17/50
(52) U.S. Cl. ................................................ 716/1; 716/5
(58) Field of Search ................................ 716/1, 2, 3, 4, 716/5, 6, 18, 11

(56) References Cited

U.S. PATENT DOCUMENTS

| 4,837,447 A | 6/1989 | Pierce et al. |
| 5,031,111 A | 7/1991 | Chao et al. ................. 364/491 |
| 5,043,920 A | 8/1991 | Malm et al. |

(List continued on next page.)

FOREIGN PATENT DOCUMENTS

| JP | 04074276 | 3/1992 |

OTHER PUBLICATIONS

Beker Et Al.; Analysis of Microwave Capacitors and IC Packages; IEEE Trans. on Microwave Theory and Techniques, vol. 42, No. 9, pp 1759–1764., Sep. 1994.*

Chang, E. et al., "Using a Statistical Metrology Framework to Identify Systematic and Random Sources of Die–and Wafer–level ILD Thickness Variation in CMP Processes," IEEE, 1995, pp. 499–502.

Chang, Keh–Jeng et al., "HIVE: An Efficient Interconnect Capacitance Extractor to Support Submicron Multilevel Interconnect Designs," IEEE, 1991, pp. 294–297.

Chang, Keh–Jeng et al., "Parameterized SPICE Subcircuits for Multilevel Interconnect Modeling and Simulation," IEEE 1992 pp. 779–789.

(List continued on next page.)

*Primary Examiner*—Matthew Smith
*Assistant Examiner*—Leigh Marie Garbowski
(74) *Attorney, Agent, or Firm*—Townsend and Townsend and Crew LLP

(57) ABSTRACT

A layout parasitics extraction system uses a connectivity-based approach to permit net-by-net extraction of layout parasitics. The system creates a connectivity-based database (1104), where geometries of a layout are organized by nets of the circuit schematic. The system allows net-by-net extraction (1124) of layout parasitics using a connectivity-based database. A user can select a net or nets for extraction. The system creates a database containing nets and their extracted layout parasitics (1132). The system can generate a netlist format file from this database to provide for back annotation of layout parasitics into a circuit schematic for further circuit analysis.

12 Claims, 29 Drawing Sheets

(5 of 29 Drawing Sheet(s) Filed in Color)

Microfiche Appendix Included
(1 Microfiche, 64 Pages)

U.S. PATENT DOCUMENTS

| | | | | |
|---|---|---|---|---|
| 5,050,091 A | * | 9/1991 | Rubin | 716/10 |
| 5,051,938 A | | 9/1991 | Hyduke | |
| 5,081,602 A | | 1/1992 | Glover | 364/578 |
| 5,095,441 A | * | 3/1992 | Hooper et al. | 716/18 |
| 5,150,308 A | * | 9/1992 | Hooper et al. | 716/18 |
| 5,202,841 A | | 4/1993 | Tani | |
| 5,210,701 A | | 5/1993 | Hana et al. | |
| 5,218,551 A | | 6/1993 | Agraval et al. | |
| 5,231,590 A | | 7/1993 | Kumar et al. | |
| 5,247,456 A | | 9/1993 | Ohe et al. | |
| 5,267,175 A | * | 11/1993 | Hooper | 716/18 |
| 5,278,105 A | | 1/1994 | Eden et al. | |
| 5,278,769 A | | 1/1994 | Bair et al. | |
| 5,299,139 A | | 3/1994 | Baisuck et al. | |
| 5,301,318 A | * | 4/1994 | Mittal | 395/600 |
| 5,303,161 A | | 4/1994 | Burns et al. | |
| 5,305,229 A | | 4/1994 | Dhar | 364/489 |
| 5,351,197 A | | 9/1994 | Upton et al. | |
| 5,359,584 A | | 10/1994 | Fukushima et al. | 369/58 |
| 5,367,468 A | | 11/1994 | Fukasawa et al. | |
| 5,381,345 A | | 1/1995 | Takegami et al. | |
| 5,384,710 A | * | 1/1995 | Lam et al. | 364/480 |
| 5,392,222 A | | 2/1995 | Noble | |
| 5,402,357 A | | 3/1995 | Schaefer et al. | |
| 5,402,358 A | | 3/1995 | Smith et al. | |
| 5,416,717 A | | 5/1995 | Miyama et al. | |
| 5,440,720 A | | 8/1995 | Baisuck et al. | |
| 5,452,224 A | | 9/1995 | Smith, Jr. et al. | 364/488 |
| 5,452,239 A | * | 9/1995 | Dai et al. | 364/578 |
| 5,459,673 A | | 10/1995 | Carmean et al. | |
| 5,461,579 A | | 10/1995 | Misheloff et al. | 364/491 |
| 5,463,563 A | | 10/1995 | Bair et al. | |
| 5,490,095 A | | 2/1996 | Shimada et al. | |
| 5,625,568 A | * | 4/1997 | Edwards et al. | 716/2 |
| 5,706,477 A | | 1/1998 | Goto | 395/500 |
| 5,787,268 A | | 7/1998 | Sugiyama et al. | 395/500 |
| 5,903,469 A | * | 5/1999 | Ho | 364/489 |
| 5,999,726 A | * | 12/1999 | Ho | 716/5 |

OTHER PUBLICATIONS

Chang, Keh–Jeng et al., "Nondestructive Multilevel Interconnect Parameter Characterization for High–Performance Manufacturable VLSI Technologies," 1993 Symposium on VLSI Technology Digest of Technical Papers, May 17–19, 1993, The Japan Society of Applied Physics, The IEEE Electron Devices Society, pp. 135–136.

Schwartz, Geraldine Cogin et al., "TXRF Surface Impurity Comparison of t–DCE and TCA Oxidation," Journal of Electrochem. Soc., vol. 139, No. 12, Dec. 1992, pp. L118–L121.

Yu, Crid et al., "Use of Short–Loop Electrical Measurements for Yield Improvement," IEEE Transactions On Semiconductor Manufacturing, vol. 8, No. 2, May, 1995, pp. 150–159.

Rugen, Irmtraud et al., "An Interactive Layout Design System with Real–Time Logical Verification and Extraction of Layout Parasitics," IEEE Jor. of Solid–State Circuits, vol. 23, No. 3, Jun. 1988, pp. 66–90.

Wang, Z. et al., "A Two Dimensional Resistance Simulator Using the Boundary Element Method," IEEE Trans. on Computer–Aided Design, vol. 11, No. 4, Apr. 1992, pp. 497,504.

Fukuda, Sanae et al., "A ULSI 2–D Capacitance Simulator for Complex Structures Based on Actual Processes," IEEE Trans. on Computer–Aided Design, vol. 9, No. 1, Jan. 1990, pp. 39–47.

McCormick, Steven P. "EXCL: A Circuit Extractor for IC Designs," $21^{st}$ Design Automation Conference Paper 39.2, 1984, pp. 616–623.

Stark, Don et al., "REDS: Resistance Extraction for Digital Simulation," $24^{th}$ ACM/IEEE Design Automation Conference, Paper 32.2, 1987, pp. 570–573.

Horowitz, Mark et al., "Resistance Extraction from Mask Layout Data," IEEE Trans. on Computer–Aided Design, vol. CAD–2, No. 3, Jul. 1983, pp. 145–150.

Hwang, Jerry P., "REX—A VLSI Parasitic Extraction Tool for Electromigration and Signal Analysis," $28^{th}$ ACM/IEEE Design Automation Conference, Paper 41.1, 1991, pp. 717–722.

Marple, David et al., "Tailor: A Layout System Based on Trapezoidal Corner Stitching," IEEE Trans. on Computer–Aided Design of Int. Cir. and Sys., vol. 9, No. 1, Jan. 1990, pp. 66–90.

Ramkumar, Balkrishna et al., "ProperCAD: A Portable Object–Oriented Parallel Environment for VLSI CAD," IEEE Trans. on Computer–Aided Design of Int. Cir. Sys., vol. 13, No. 7, Jul. 1994, pp. 829–842.

Belkale, K.P. et al., "Parallel Algorithms for VLSI Circuit Extraction," IEEE Trans. on CAD of Integrated Cir. & Systems, vol. 10, No. 5, May 1991, pp. 604–618.

Chiang, Kuang–Wei, "Resistance Extraction and Resistance Calculation on GOALIE2," Proc. of the Design Auto. Conf., Las Vegas, Nevada, Jun. 25–29, 1989, Paper 40.3, pp. 682–685.

Ladage, L. et al., "Resistance Extraction and Along the Current Flow," Proc. of the Custom Integrated Circuits Conf., San Diego, California, May 9–12, 1993, pp. 17.5.1 to 17.5.4.

* cited by examiner

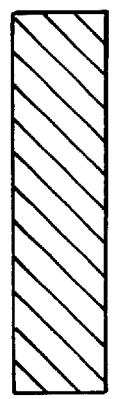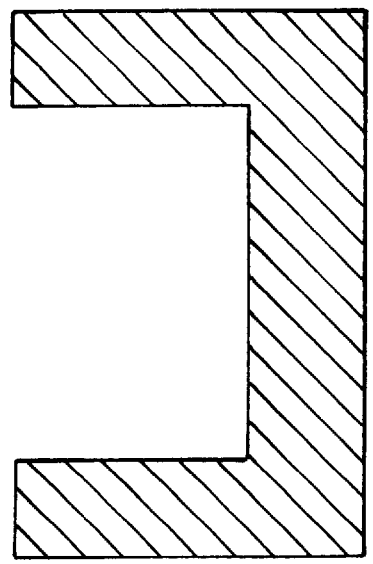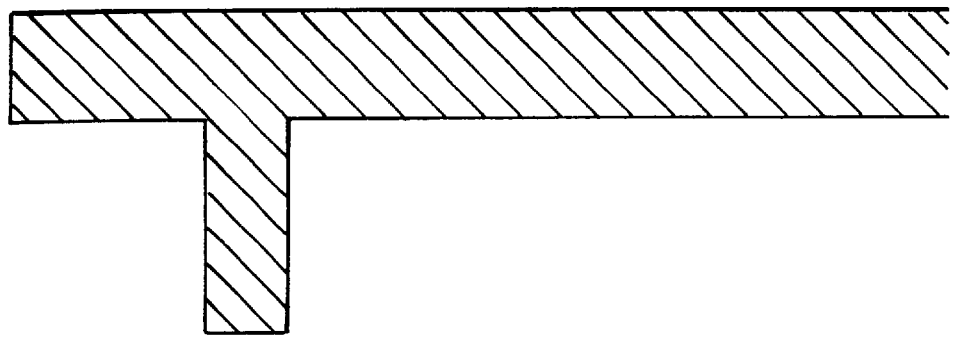
FIG. 6.

System Commands

```
*System;; System block
    DBUnit = 0.001 Um;; DDB length unit, unit is case in
            default is microns = Um RESOlution = 0.05 Um;; DDB digitization grid unit
              default is microns = Um CAP-Mode = 3; capacitor simulation model number
              3 = parallel-plate, empirical 2D model
              valid numbers range from 1 to 39
              1-19 = empirical model; 20-39 = field
              solver model CAP-Unit = ff; pf = picofarads, or ff = femtofarads
              case insensitive, default is ff RES-UNIT  = mohm; ohm or mohm = milliohm
               case insensitive, default is mohm PROBe-text = TEST1; probe text file name, case sensi-
              tive;probe text file name is case sensitive PROcess = process_name; process name stored in model
            header process_name is case sensitive SUMmary = sum_filename; extraction report summary
            filename; sum_filename is case sensitive CAP_ENVIRONMENT = PHYA CPLYB ALA ALB; case insensitive
        interconnect layers for capacitance simulation
        environment layers should be same for MODELING
        and RCEXTRACT steps EXTract-net-file = netfile2;
            selected nets input filename is case sensitive INPUT-DRACULA  =../LPEdata; DRACULA database directory OUTPUT-SPICE = Spice; SPICE output file name
    OUTPUT-GDS2  = output,.GDS2 out_TopCell; GDSII output
            filenames.
    OUTPUT-TIMEMILL = TimeMill; TimeMill output file name
    OUTPUT-POWERMILL = PowerMill; PowerMill output file
            name above output file names are case sensitive
```

FIG. 18.

Library Commands
```
*Library;; Library block

This section contains the file names to be used for
   storing the geometry model library information
   generated by the MODELING command.

save-R-model=New_R_Mod; New R geometry model library
       file
   save-C-model=New_C_Mod; New C geometry model library
       file
   R-model=Old_R_Mod; Old R geometry model library file
   C-model=Old_C_Mod; Old R geometry model library file
       above output file names are case sensitive
```
FIG. 19.

Display Commands
```
*Display;; Display block

All layer names in this section must agree exactly with
   the internal Dracula database (DDB) layer names.

All layer numbers in this section must agree exactly
   with the internal Dracula database (DDB) layer numbers.

All Dracula database (DDB) layer names limited to 8
   characters.  First DDB layer name character must be
   one of a to z, or A to Z.  DDB layer name characters 2
   to 8 may be a-z,A-Z, or a number from 0 to 9.
   DDB layer name examples: POLY, pdiff, ALA, M1, MET12345

ALA   = 3; metal 1
   ALB   = 4; metal 2

POLY  = 25; poly
   plya  = 23;
   cplyb = 24;

CONT  = 12; contact
   thol  = 15; contact hole

NDIFF = 31; n diffusion
   PDIFF = 32; p diffusion
```
FIG. 20.

Technology Commands

```
*Technology;; Technology block
   All layer names in this section must agree exactly with
   the internal Dracula database (DDB) layer names.

Interconnection ALA:; Interconnection ALB:;
   thickness= 0.8;;
   oxide-thickness = 1.2
   oxide-permitivity = 3.2;; relative permitivity
   sheet-resistance = 0.001 ohm;;
   cap=environment-range = 5; um Interconnection PLYA:; Interconnection CPLYB:;
   thickness= 0.45;;
   oxide-thickness = 1.2
   oxide-permitivity = 3.2;; relative permitivity
   sheet-resistance = 0.001 ohm;;
   cap-environment-range = 5; um Contact hole; Contact cont; Contact pbcon; Contact thol;
   resistance = 0.001 ohm;
   capacitance = 0.5 ff substrate sub; semiconductor substrate
   sheet-resistance = 2.1 ohm;
   capacitance = 0.9 ff mos p
   device = pgate;
   drain  = pdiff   sheet-res = 3.0
   source = pdiff   sheet-resistance = 3.0
   gate   = plya    oxide-thick = 0.45 oxide-per = 3.2 mos n
   device = ngate;
   drain  = ndiff   sheet-res = 4.0
   source = ndiff   sheet-resistance = 4.0
   gate   = plya    oxide-thick = 0.45 oxide-per = 3.2
```

*FIG. 21.*

Connectivity Commands
*CONNECTIVITY

The connect-layer-sequence specifies the sequence of
　　semiconductor interconnect layers from bottom to top.

connect-layer-sequence = **ndiff pdiff plya cplyb ala
　　　　　　　　　　　　　　　 alb**

The connect statement defines how layera is connected
　　to layerb by way of contact type:
　　Example: connect layera layerb by contact-type

```
connect ala     alb     by  hole
connect ala     plya    by  cont
connect plya    cplyb   by  thol
connect ala     ndiff   by  cont
connect ala     pdiff   by  cont
connect plya    ndiff   by  pbcon
connect cplyb   ndiff   by  thol
```

*FIG. 22.*

CONNECTIVITY-BASED APPROACH FOR EXTRACTING LAYOUT PARASITICS

CROSS-REFERENCES TO RELATED APPLICATIONS

This application is a continuation of U.S. patent application Ser. No. 09/012,603, now U.S. Pat. No. 5,999,726 filed Jan. 23, 1998, which is a continuation of Ser. No. 08/895,098 filed Jul. 16, 1997, now U.S. Pat. No. 6,128,768 which is a continuation of 08/468,034, filed Jun. 6 1995, now U.S. Pat. No. 5,903,469 which is a continuation-in-part of U.S. patent application Ser. No. 08/335,592, filed Nov. 8, 1994, now U.S. Pat. No. 5,828,580 which are incorporated by reference.

COPYRIGHT NOTICE

A portion of the disclosure of this patent document contains material which is subject to copyright protection. The copyright owner has no objection to the xerographic reproduction by anyone of the patent document or the patent disclosure in exactly the form it appears in the U.S. Patent and Trademark Office patent file or records, but otherwise reserves all copyright rights.

APPENDIX

A microfiche appendix of one sheet with 64 frames is included in this application.

BACKGROUND OF THE INVENTION

The present invention relates to the field of designing and fabricating integrated circuits. More specifically, the present invention relates to a system for extracting layout parasitics.

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer designs the integrated circuit by creating a circuit schematic indicating the electrical components and their interconnections. Generally, designs are simulated by computer to verify functionality and ensure performance goals are satisfied.

Integrated circuits are typically fabricated using a photolithography technique where a semiconductor material is selectively exposed to light by using masks. the exposed or unexposed areas of the semiconductor material are processed to form the features of the integrated circuit such as transistors and interconnects. Processing continues layer by layer until all the layers of the integrated circuit are formed.

Each mask contains the geometries for a particular layer of the integrated circuit. For example, a geometry may be used to form the metal interconnection between two transistors. To generate the masks for an integrated circuit, the circuit designer first creates a layout of the electrical components that implements the design in a circuit schematic. This layout is generally contained in a computer database having all the geometries for all mask layers. From this computer database, the masks are generated.

The layout of an integrated circuit contains parasitic resistances and capacitances from the interconnections and devices. The values of these parasitics depend on the process parameters, shape and dimensions of a particular geometry, and relationship of a particular geometry to other geometries. These parasitics affect the performance and possibly the functionality of an integrated circuit. Consequently, during the design phase of an integrated circuit, these parasitics are extracted from a layout and taken into consideration during circuit simulation. Two conventional approaches for extracting layout parasitics are the full-chip Boolean operation method and direct simulation method.

The full-chip Boolean operation method extracts full-chip layout parasitics. A user must specify the Boolean operations that are to be performed on the layout layers. The user must also provide a table of process parameters and coefficient values. In order to specify these Boolean operations, the user undertakes the sometimes intricate task of writing custom equations for each design. As integrated circuits continue to increase in size, functionality, and complexity, so does the time and effort required to develop the correct Boolean operation.

The approach of using Boolean operations to calculate resistance and capacitance parasitic data was developed over fifteen years ago. The simple formulas generated by this approach were previously sufficient. However, as feature sizes of VLSI chips approach 0.3 micron and smaller, this approach cannot reliably extract layout parasitics information accurately enough to meet the performance requirements for interconnect simulations and timing analysis of present-day high-performance VLSI designs.

This full-chip Boolean operation method is typically performed as a batch extraction and uses the command file to extract parasitic capacitances for the entire integrated circuit. Consequently, this becomes very time consuming because the approach computes parasitic resistance and capacitance values for geometries in total isolation.

A user who desires only to extract data on a particular net, such as a clock net, must extract an entire integrated circuit to get the desired information. After this information is obtained and analysis is performed on the net, the user will want to make changes if the targeted performance goal is not achieved. After any changes are made, a user will need to extract the entire design once again to perform the required analysis. These design iterations can take weeks to complete. Even if this method is successfully used, the user cannot generate a complete distributed resistance and capacitance (RC) netlist (which provides greater accuracy) suitable for timing or interconnect simulation.

The above approach also uses textual data to pass information to and from the extraction process, which is not a format directly compatible with many software programs. Another disadvantage of the full-chip Boolean net is that a user cannot select a net for extraction. Furthermore, there is no graphical interface or viewer that permits a user to view the design or highlight and select a net or block for extraction of the parasitic data. A user must extract the entire design each time a change is made to the layout or extraction is required on any part of the chip.

The direct simulation method has been implemented to extract small-area layout parasitics. It is based on a user specifying a particular area or region of an integrated circuit for extraction. This area is then divided into smaller areas which a field solver can simulate. However, a drawback is that the field solver takes a substantial amount of time to simulate even for relatively small areas. Consequently, this approach is limited to small-area parasitic extraction. Although some improvements have been made in the art of field solvers, extraction time is still excessive. Furthermore, a field solver approach cannot generate a complete net-by-net distributed RC netlist including transistor parameter timing or power simulation.

The direct simulation method is also not net-based. The direct simulation method performs calculations only on selected areas, regions, geometries, or structures to extract, but not a net. A net, such as a clock net, may extend throughout an integrated circuit; it would not be practical for a field solver to consider such a large area.

As the feature sizes of integrated circuits are continually shrinking, operating frequencies of integrated circuits are increasing, and the number of transistors per integrated circuit is increasing, the performance of integrated circuits depend more on layout parasitics, especially the layout parasitics of the interconnect. Furthermore, since the number and complexity of integrated circuits continues to increase, there is a need for better, faster, more accurate, and improved layout parasitics extraction methods.

SUMMARY OF THE INVENTION

The present invention is a layout parasitic extraction system. In particular, the layout parasitics are extracted using a connectivity-based approach. This will allow extraction of layout parasitics on a net-by-net basis. The system generates a connectivity-based database where geometries of the layout are organized by nets of the circuit schematic or netlist. Using this connectivity database, parasitics for one or more nets of the integrated circuit are extracted. The types of parasitics extracted include resistances and capacitances. The user may select which nets are to be extracted; the unselected nets will not be extracted.

The system may be coupled with layout network connectivity extraction (NCE) or layout versus schematic checker (LVS) to allow net-by-net layout parasitic extraction under user input without again requiring whole chip connectivity extraction. The system takes user specified information to automatically create an extraction routine for the particular design. The system can display the design to allow for interactive extraction at the net, block, or integrated circuit level. The system uses the layout net or net number to extract selected net parasitics in conjunction with a file of transistors to create a complete netlist for timing simulation.

Another aspect of the present invention is the use of a lookup library of predefined geometries to minimize extraction time. Any new geometries discovered during extraction are added to the lookup library. For new geometries, the system calls the parasitic simulator directly to calculate the value. The library is then updated with this new geometry. When running the layout extraction program, parasitics for geometries that match those stored in the lookup library do not need to be recalculated. The parasitic value from the lookup library is used.

After the simulator calculates the required parasitic values, the system may provide a netlist to other simulators for further analysis and simulation. These simulations will provide more accurate results since the parasitics have been more accurately calculated from the layout.

A further aspect of the present invention is quasi-3D extraction of capacitance parasitics. Capacitance effects arise not only between geometries within one layer, but also between geometries on different layers of the integrated circuit. For example, there will be parasitic capacitance between metal-1 and metal-2 layers.

The present invention accounts for these three dimensional effects using quasi-3D extraction. Parasitics for a first cross-section of the geometry are extracted. Parasitics for a second cross-section of the same geometry are extracted. The first and second cross sections are transverse or perpendicular to each other. By combining these parasitics, the present invention obtains a quasi-3D parasitic value that accounts for parasitic capacitance. This quasi-3D approach allows the fast calculation of these parasitics, especially when compared to a rather time-consuming calculation by a field solver program.

Other objects, features, and advantages of the present invention will become apparent upon consideration of the following detailed description and the accompanying drawings, in which like reference designations represent like features throughout the figures.

BRIEF DESCRIPTION OF THE DRAWINGS

The file of this patent contains at least one drawing executed in color. Copies of this patent with color drawings will be provided by the U.S. Patent and Trademark Office upon request and payment of the necessary fee.

FIG. 6 is a diagram of a metal-1 layer of the layout of the circuit schematic;

FIG. 18 is a system commands functional block of a sample technology file;

FIG. 19 is a library commands functional block of a sample technology file;

FIG. 20 is a display commands functional block of a sample technology file;

FIG. 21 is a technology commands functional block of a sample technology file;

FIG. 22 is a connectivity commands functional block of sample technology file;

DETAILED DESCRIPTION

Figure 1:
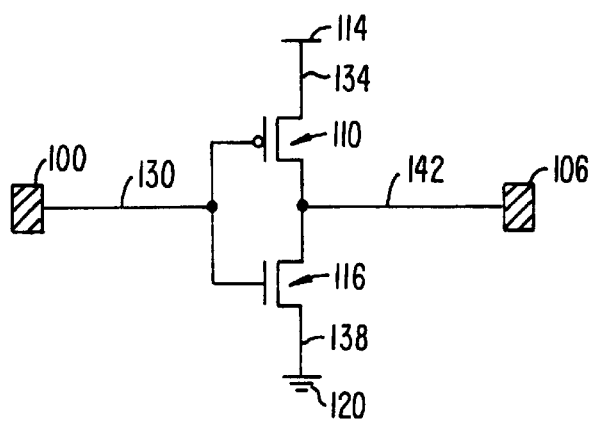
FIG. 1 is a diagram of an example of a circuit schematic.

FIG. 1 is an example of a circuit schematic containing a circuit design. A circuit design is a circuit, often containing electronic or electrical components, that is designed to a provide a desired functionality. A circuit design may contain many circuit schematics. Some examples of circuit designs include microprocessors, memories, programmable logic devices (PLDs), application specific integrated circuits (ASICs), operational amplifiers, differential amplifiers, power supply regulators, registers, logic gates, printed circuit boards, tuners, and the like.

The schematic of FIG. 1 shows a CMOS inverter. This circuit performs the logical function of an inverter or NOT gate. The inverter has an input pad 100 and an output pad 106. A PMOS transistor 110 is coupled between a VDD source 114 and output pad 106. An NMOS transistor 116 is coupled between output. pad 106 and a VSS source 120. Input pad 100 is coupled to a gate of PMOS transistor 110 and a gate of NMOS transistor 116.

The circuit schematic contains circuit elements and nets. Circuit elements are basic elements used to design and create circuits. Circuit elements include transistors, resistors, capacitors, voltage sources, current sources, input pads, output pads, logic gates, registers, counters, and many others. In FIG. 1, input pad 100, output pad 106, PMOS transistor 110, VDD source 114, NMOS transistor 116, and VSS source 120 are circuit elements.

Nets are the connections between the circuit elements. Sometimes nets are referred to as the nodes of the circuit. For example, in FIG. 1, a net 130 connects input pad 100 to the gate of PMOS transistor 110 and the gate of NMOS transistor 116. A net 134 connects PMOS transistor 110 to VDD source 114. A net 138 connects NMOS transistor 116 to VSS source 120. And, a net 142 connects output pad 106 to PMOS transistor 110 and NMOS transistor 116.

Figure 2:
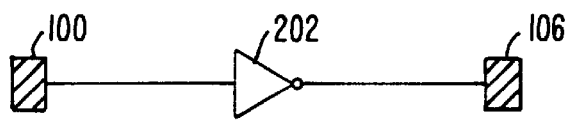
FIG. 2 is a diagram of a symbolic embodiment of the circuit schematic of FIG. 1.

FIG. 2 is another circuit schematic representation of the inverter in FIG. 1. FIG. 2 shows a standard logic symbol representation for an inverter 202. Inverter 202 is coupled between input pad 100 and output pad 106. The circuit schematic of FIG. 2 is functionally equivalent to the circuit schematic of FIG. 1. Circuit elements PMOS transistor 110, NMOS transistor 116, VDD source 114, and VSS source 120, are not shown, but are represented by inverter 202. FIG. 2 also contains nets. One net connects input pad 100 to an input of inverter 202, while another net connects output pad 106 to an output of inverter 202.

Symbols such as inverter 202 are used to simplify circuit schematic drawings, thus making designs more manageable and easier to understand. This is desirable especially when creating complex circuit schematics containing many circuit elements and many nets. Others symbols include, for example, AND gates, OR gates, NAND gates, and NOR gates, which are well known by those in the art.

Typical electrical designs contain many circuit elements and nets. For example, in a design, inverter 202 is a logical building block that may be combined with other inverters 202, transistors, logic gates, inputs, outputs, resistors, capacitors, voltage sources, and other elements to create a particular functionality.

Figure 3:
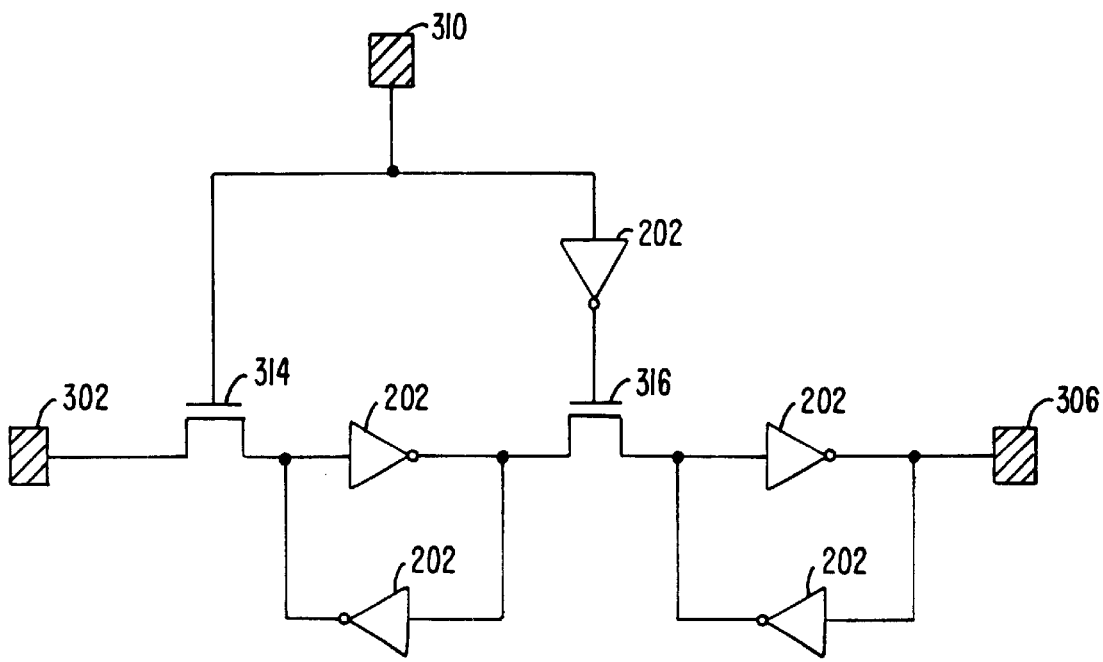
FIG. 3 is a diagram of an example of a more complex circuit schematic.

An example of a more complex design is shown in FIG. 3, comprising many circuit elements and nets. FIG. 3 is a circuit schematic of a negative-edge-triggered D-flip-flop. This design includes numerous inverters 202 of FIG. 2. The D-flip-flop has an input pad 302, output pad 306 and clock pad 310. An NMOS pass transistor 314 is coupled between input pad 301 and an inverter 202. Clock pad 310 is coupled to a gate of NMOS pass transistor 314. An NMOS pass transistor 316 is coupled between inverter 202 and another inverter 202, which is coupled to output pad 306. Clock pad 310 is coupled, through an inverter 202, to a gate of NMOS pass transistor 316. An inverter 202 feedbacks from output pad 306 to an output of pass transistor 316. An inverter 202 feedbacks from an input to NMOS pass transistor 316 to an output of NMOS pass transistor 314. The connections between the circuit elements described above are nets for this design.

Figure 4:
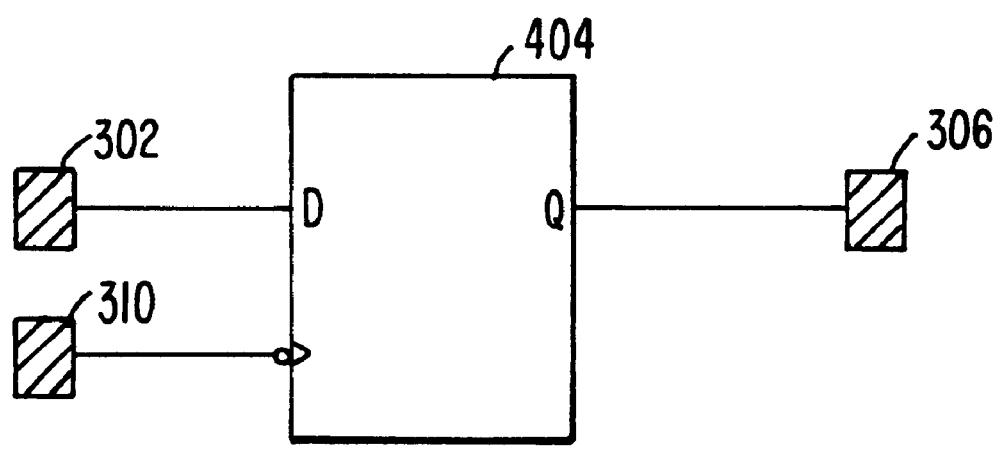
FIG. 4 is a diagram of a symbolic embodiment of the circuit schematic of FIG. 3.

A symbolic representation of the D-flip-flop of FIG. 3 is shown in FIG. 4. The circuit schematic of FIG. 4 is functionally equivalent to the circuit schematic of FIG. 3. D-flip-flop symbol 404 represents the circuitry in FIG. 3. Input pad 302 is coupled to a D input of D-flip-flop 404. Output pad 306 is coupled to a Q output of D-flip-flop 404. And, clock pad 310 is coupled to a clock input of D-flip-flop 404. D-flip-flop 404 may be coupled with other circuit elements to create more complex design schematics.

Figure 5:
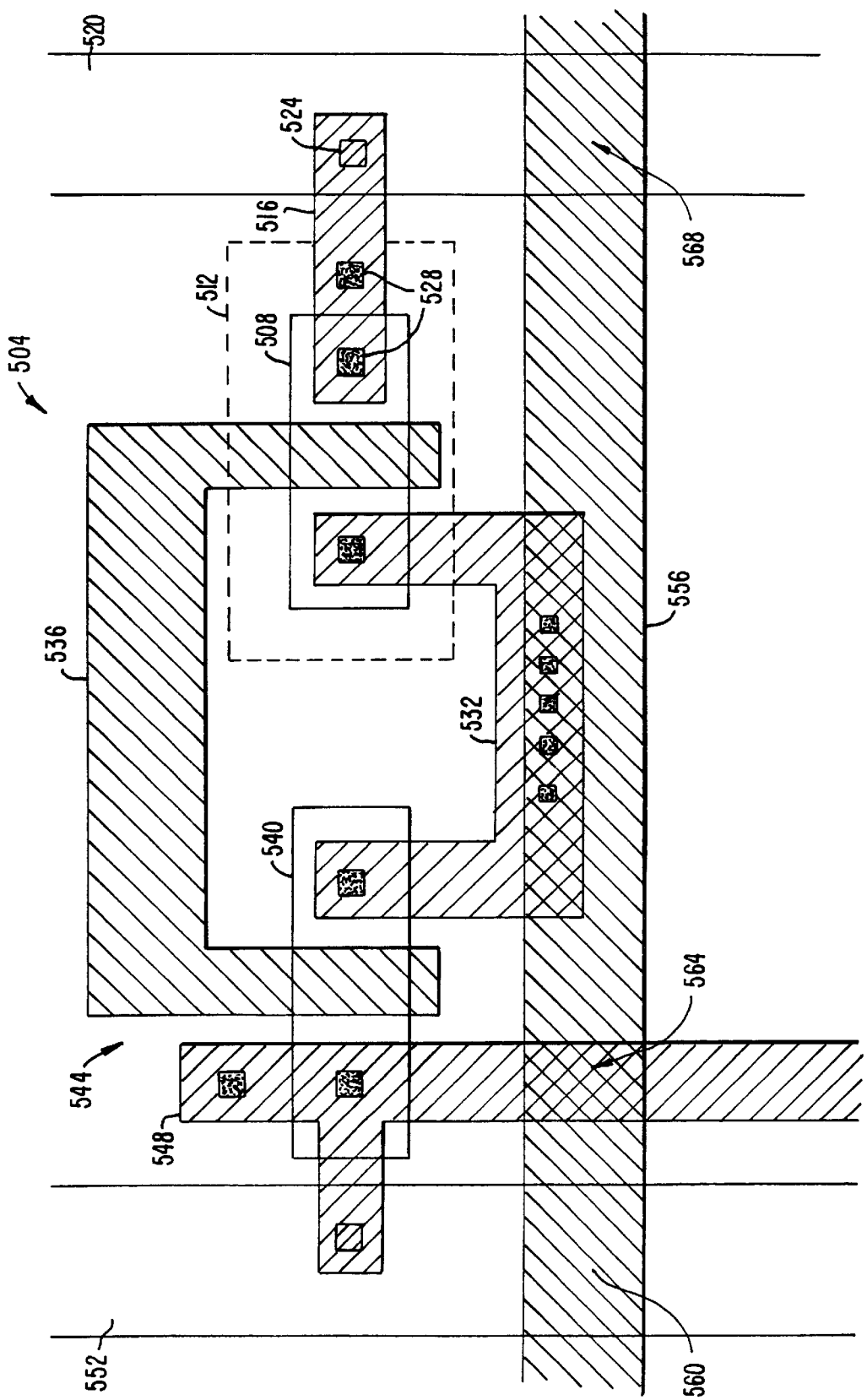
FIG. 5 is a diagram of a layout of the circuit schematics of FIGS. 1 and 2.

FIG. 5 shows an example of a layout 504 of the inverter in the circuit schematics of FIGS. 1 and 2. A layout is a physical representation of the circuit, as it will be fabricated in an integrated circuit. Integrated circuits may be manufactured in various process technologies including silicon semiconductor, gallium arsenide semiconductor, and silicon over sapphire. As shown in FIG. 5, layout 504 is for a CMOS technology silicon semiconductor process. Many details of semiconductor layout and processing are not necessary for an understanding of the present invention and such details are not described below, but would be known to those skilled in the art.

Layout 504 contains a plurality of polygons or geometries representing the various semiconductor materials used to create the circuit elements and nets (i.e. connections) of FIGS. 1 and 2. The representations of different processing materials are shown in various shading and fill patterns. Moreover, layout 504 may represent only a portion of the integrated circuit. Typically, a integrated circuit includes many layouts similar to layout 504.

PMOS transistor 110 is formed by a p-diffusion region 508 in an n-well tub 512. One terminal of PMOS transistor 110 is coupled through a metal-1 conductor 516 to a metal-2 conductor 520. Metal-2 conductor 520 is coupled to a VDD source at another location on the integrated circuit. Metal-1 conductor 516 is coupled through a via 524 to metal-2 conductor 520. Metal-1 conductor 516 is also coupled to p-diffusion region 508 by a contact 528. Metal-1 conductor 516 is coupled to n-well tub 516 through another contact 528. Another terminal of PMOS transistor 110 is coupled through metal-1 conductor 532 to a layout of NMOS transistor 116. A gate of PMOS transistor 110 is formed using polysilicon region 536. Polysilicon 536 is also an input of the inverter in the layout. Metal-1 conductor 532 is an output of the inverter.

NMOS transistor 116 is formed by an n-diffusion region 540 on substrate 544. One terminal of NMOS transistor 116 is coupled through a metal-1 conductor 548 (through a contact and a via) to metal-2 conductor 552. Metal-2 conductor 552 is coupled to a VSS source at another location on the integrated circuit. Metal-1 conductor 548 also couples, through a contact, the VSS source to substrate 544. Another terminal of NMOS transistor 116 is coupled through metal-1 conductor 532 to PMOS transistor 110. Metal-1 conductor 532 is also coupled, through contacts, to polysilicon conductor 556. Polysilicon conductor 556 is also an output of the inverter.

Layout 504 contains layout parasitics that are a result of the physical properties and characteristics of the semiconductor processing material, as well as interactions between different semiconductor materials. These parasitics include parasitic resistances, parasitic capacitances, and other similar parameters. For example, polysilicon may have a resistance of about twenty-five ohms per square. As a consequence, there will be an amount of parasitic resistance depending on the distance and width of the polysilicon conductor between connections.

Generally, a parasitic capacitance is formed when one semiconductor processing material crosses, overlaps, or overlays another semiconductor processing material. A parasitic capacitance is also formed when semiconductor materials carrying different signals are in close proximity to another. Parasitic capacitances often result from crisscrossing conductors used to conduct different logic signals. Parasitic capacitances are not usually desirable because they can degrade circuit performance. It is desirable to minimize parasitics, especially for the "critical path" of the integrated circuit.

A parasitic capacitor can store charge in the area formed by the overlapping materials. The shape of a parasitic capacitor may be any polygon shape, depending on how materials overlap. The shape is often square or rectangular. The amount of parasitic capacitance depends on the size of a parasitic capacitor and also on the semiconductor processing. In particular, the nature of the dielectric material between two materials and the thickness of the dielectric material between the two materials are important factors.

For example, when a polysilicon conductor crosses or physically overlaps a metal-1 conductor, metal-2 conductor, or other semiconductor material, there will be a parasitic capacitance formed between the materials. In FIG. 5, polysilicon conductor 556 has three parasitic capacitors. In particular, polysilicon conductor 556 crosses metal-2 conductor 552, forming a parasitic capacitance 560. Polysilicon conductor 556 also crosses metal-1 conductor 548, forming a parasitic capacitance 564. And, polysilicon 556 crosses metal-2 conductor 520, forming a parasitic capacitance 568. Parasitic capacitors 560, 564, and 568 are rectangularly shaped parasitic capacitors.

Polysilicon conductor 556 overlays metal-1 conductor 532, but this overlay does not form a parasitic capacitor. Capacitances result from dissimilar charges applied to the plates of the capacitor. Since polysilicon conductor 556 and metal-1 conductor 532 are connected by contacts, they carry the same signal or charge and do not produce a parasitic capacitance.

As discussed earlier, the amount of parasitic capacitance depends on the semiconductor processing. Typically, for the same given area, a parasitic capacitance between polysilicon and metal-1 is greater than a parasitic capacitance between polysilicon and metal-2. This is due to a greater dielectric distance (i.e., oxide thickness) between polysilicon and metal-2 than polysilicon and metal-1.

Also, although two semiconductor materials may not be shown overlapping in FIG. 5, these materials may nevertheless overlap in the finished product due to the materials becoming overlapped as a result of the semiconductor processing. These overlaps will create parasitic capacitance. Also, the area of the parasitic capacitance created by overlapping areas may be larger than that shown in the layout resulting from the semiconductor processing.

Furthermore, the nets of the layout can be contained on many different materials, and can extend across an entire integrated circuit. For example, a signal may be conducted on metal-1 for a distance, then polysilicon for another distance, and then finally in metal-1 again. Parasitic resistances and capacitances along the path of the net contribute to the total parasitics for the entire net. The parasitics for the entire net will be determined by the layout parasitics extraction system of the present invention.

Layout parasitics can be determined by extracting them from the geometries (or polygons) in the layout. These layout parasitics are important in determining the behavior and performance of electrical circuits, especially transient response. The more accurately layout parasitics are determined, the more accurately circuit behavior and performance can be predicted.

Figure 7:
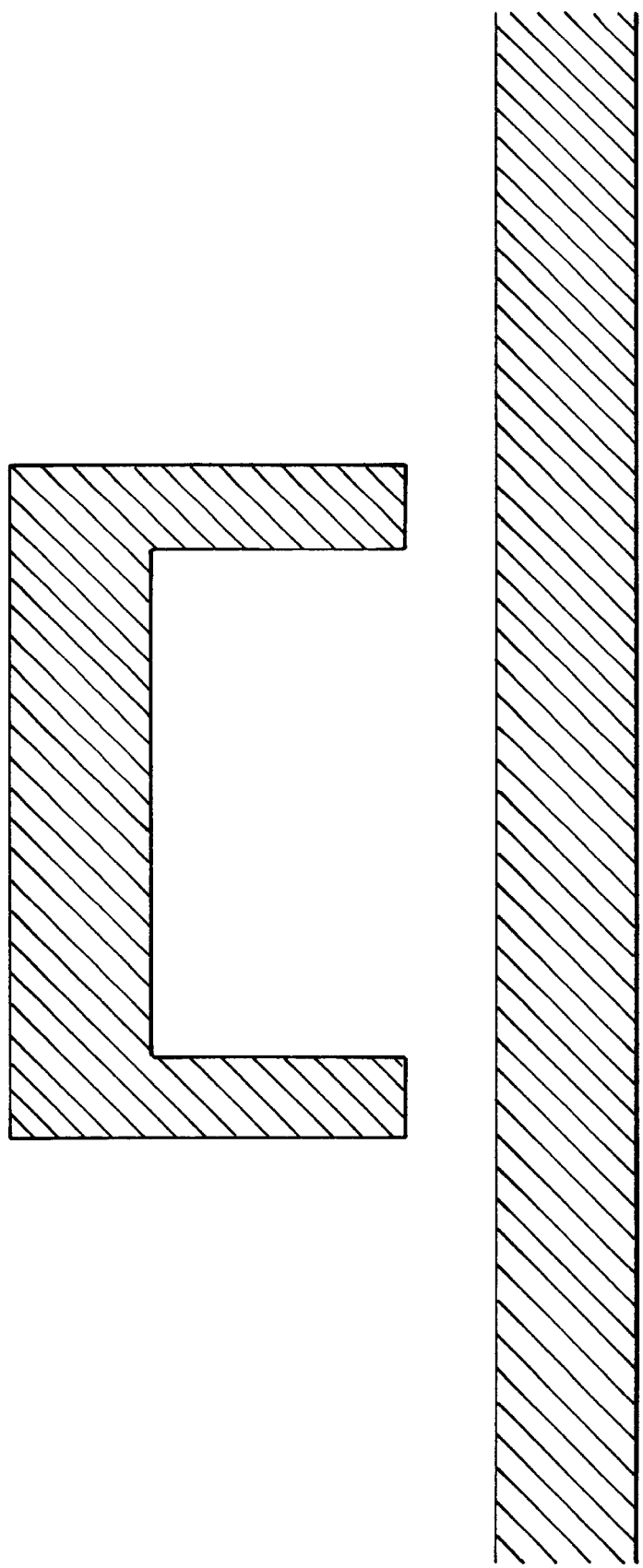
FIG. 7 is a diagram of a polysilicon layer of the layout of the circuit schematic.

FIG. 6 is a diagram of the metal-1 conductor layer of the layout of FIG. 5. FIG. 7 is a diagram of the polysilicon layer of the layout of FIG. 5. FIG. 6 and FIG. 7 more clearly show how layout is comprised of various layers, representing the various semiconductor materials. Moreover, the other semiconductor materials in FIG. 5 also have a respective layer. These layers are combined to create the semiconductor structures on a semiconductor wafer.

In particular, the various layers of the layout, containing polygons and geometries, are used to create a set of semiconductor processing masks. These semiconductor process masks are used in a step-by-step photolithography process to create a semiconductor integrated circuit. The resulting circuit elements, transistors, geometries, and other similar structures on the integrated circuit perform the same function as the circuit in the circuit schematic on which the layout may be based. Therefore, a circuit schematic represents information about circuit elements and nets. A layout includes polygons and geometries which represent the circuit elements and nets as they will be processed on a semiconductor integrated circuit.

Figure 8:
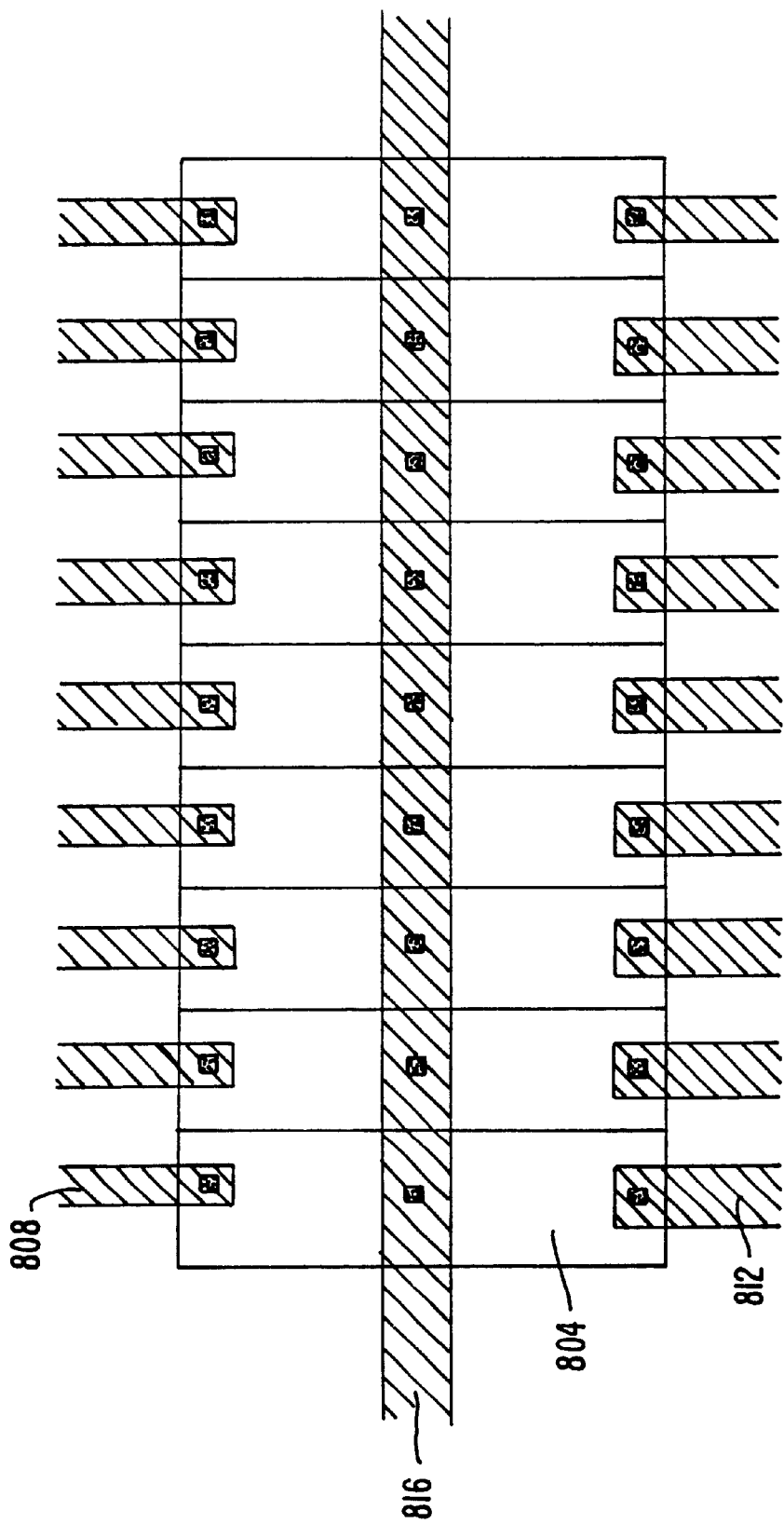
FIG. 8 is a diagram of a layout of the circuit schematics of FIGS. 3 and 4.

FIG. 8 is a layout of a plurality of D-flip-flops of FIG. 3 and FIG. 4. Box 804 contains a layout of one D-flip-flop of FIG. 3 and FIG. 4. The details of the layout of the D-flip-flop are not shown to simplify the diagram. In FIG. 8, there are nine D-flip-flops. Each D-flip-flop has an input 808 using a metal-1 conductor and output 812, also using a metal-1 conductor. A global clock line 816 on metal-1 is coupled to the clock input of the D-flip-flops. FIG. 8 shows an example of a layout of a plurality of D-flip-flops of FIGS. 3 and 4.

Layout parasitics within box 804 may be extracted in a similar fashion to that described above for FIG. 5. In FIG. 8, all boxes 804 would have similar layout parasitics. However, metal-1 lines 808 and 812 may have different layout parasitics. Metal-1 lines 808, 812, and 816 may be routed to different locations, varying in length, as well as path. For example, a particular metal-1 line 812 may have more jogs, reversals, corners, angles, and other similar differences from another metal-1 line 812. An extraction of the layout parasitics these nets would show these differences.

Furthermore, global clock line 816 would most likely be routed to many different circuits, structures, and geometries on an integrated circuit. Hence, global clock line 816 will likely have distributed layout parasitics-layout parasitics distributed along its path. For example, there may be a resistance and capacitance component between the connections of various components and circuit elements. Distributed layout parasitics should also be taken into consideration for more accurate simulation results. Therefore, the layout parasitics must be extracted to take account of distributed layout parasitics. A further discussion of distributed layout parasitics is given below.

Figure 9:
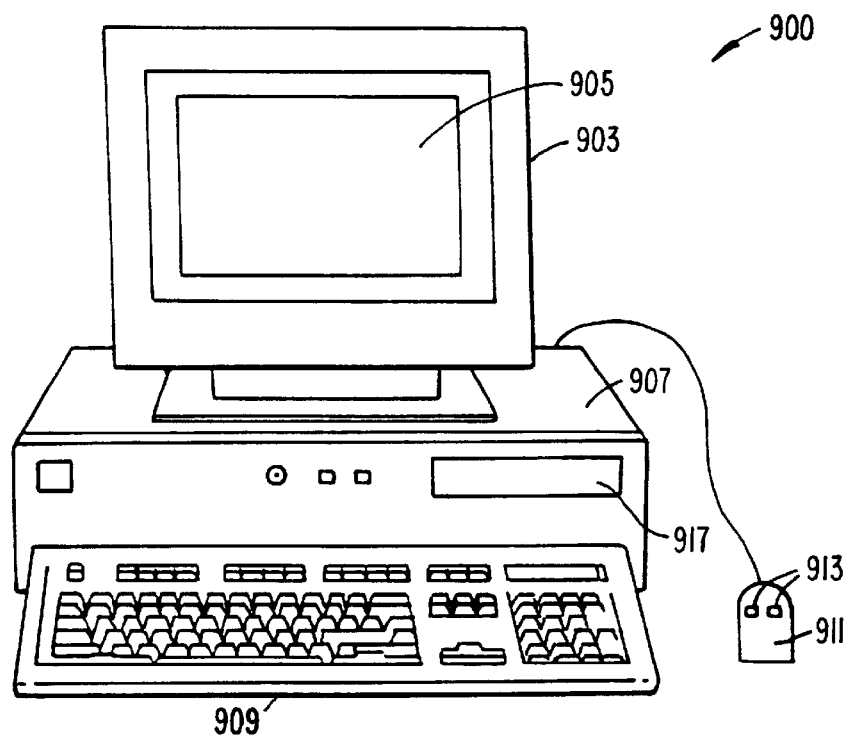
FIG. 9 illustrates an example of a electronic system used on which the layout parasitics extraction system of the present invention may be embodied.

FIG. 9 illustrates an example of a layout extraction system of the present invention. More specifically, FIG. 9 may comprise a computer system used to execute the software of the present invention. FIG. 9 shows a computer system 900 which includes a monitor 903, screen 905, cabinet 907, keyboard 909, and mouse 911. Mouse 911 may have one or more buttons such as mouse buttons 913. Cabinet 907 houses familiar computer components (not shown) such as a processor, memory, mass storage devices 917, and the like. Mass storage devices 917 may include mass disk drives, floppy disks, magnetic disk, fixed disk, hard disk, CD-ROM, CD-WORM, tape storage, and other similar media, and combinations of these. A binary, machine-executable version, of the software of the present invention may be stored or reside on mass storage devices 917. Furthermore, the source code of the software of the present invention may also be stored or reside on mass storage devices 917.

Figure 10:
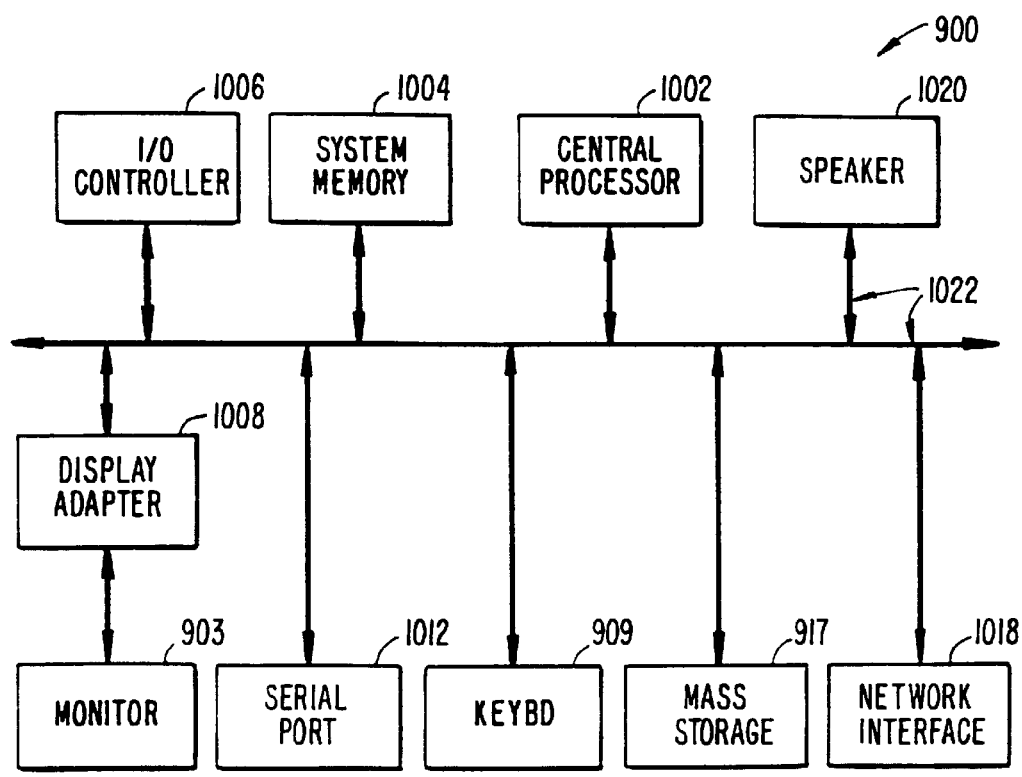
FIG. 10 shows a system block diagram of a typical electronic system on which the present invention may be embodied.

FIG. 10 shows a system block diagram of computer system 900 used to execute the software of the present invention. As in FIG. 9, computer system 900 includes monitor 903, keyboard 909, and mass storage devices 917. Computer system 900 further includes subsystems such as central processor 1002, system memory 1004, I/O controller 1006, display adapter 1008, serial port 1012, network interface 1018, and speaker 1020. Other computer systems suitable for use with the present invention may include additional or fewer subsystems. For example, another computer system could include more than one processor 1002 (i.e., a multiprocessor system) or a system may include a cache memory.

Arrows such as 1022 represent the system bus architecture of computer system 900. However, these arrows are illustrative of any interconnection scheme serving to link the subsystems. For example, speaker 1020 could be connected to the other subsystems through a port or have an internal direct connection to central processor 1002. Computer system 900 shown in FIG. 10 is but an example of a computer system suitable for use with the present invention. Other configurations of subsystems suitable for use with the present invention will be readily apparent to one of ordinary skill in the art.

Furthermore, circuit schematics of a circuit design may be input and stored on a system such as shown in FIGS. 9 and 10. More specifically, the circuit schematics may be stored in a circuit schematic database. This circuit schematic database contains the circuit elements and nets of the circuit schematic. For example, in a circuit schematic database, the circuit elements are assigned unique circuit element numbers, and are related by nets, which are assigned arbitrary net numbers.

A layout of a circuit design may also be input and stored on a system such as shown in FIGS. 9 and 10. More specifically, the layout may be stored in a layout database. This layout database contains the geometries and polygons of the layout. For example, geometries of a layout may be represented by their coordinates and relationship to an origin. Furthermore, the layout database may also include information on a layer number of the geometry (which represents a particular semiconductor processing layer).

Figure 11:
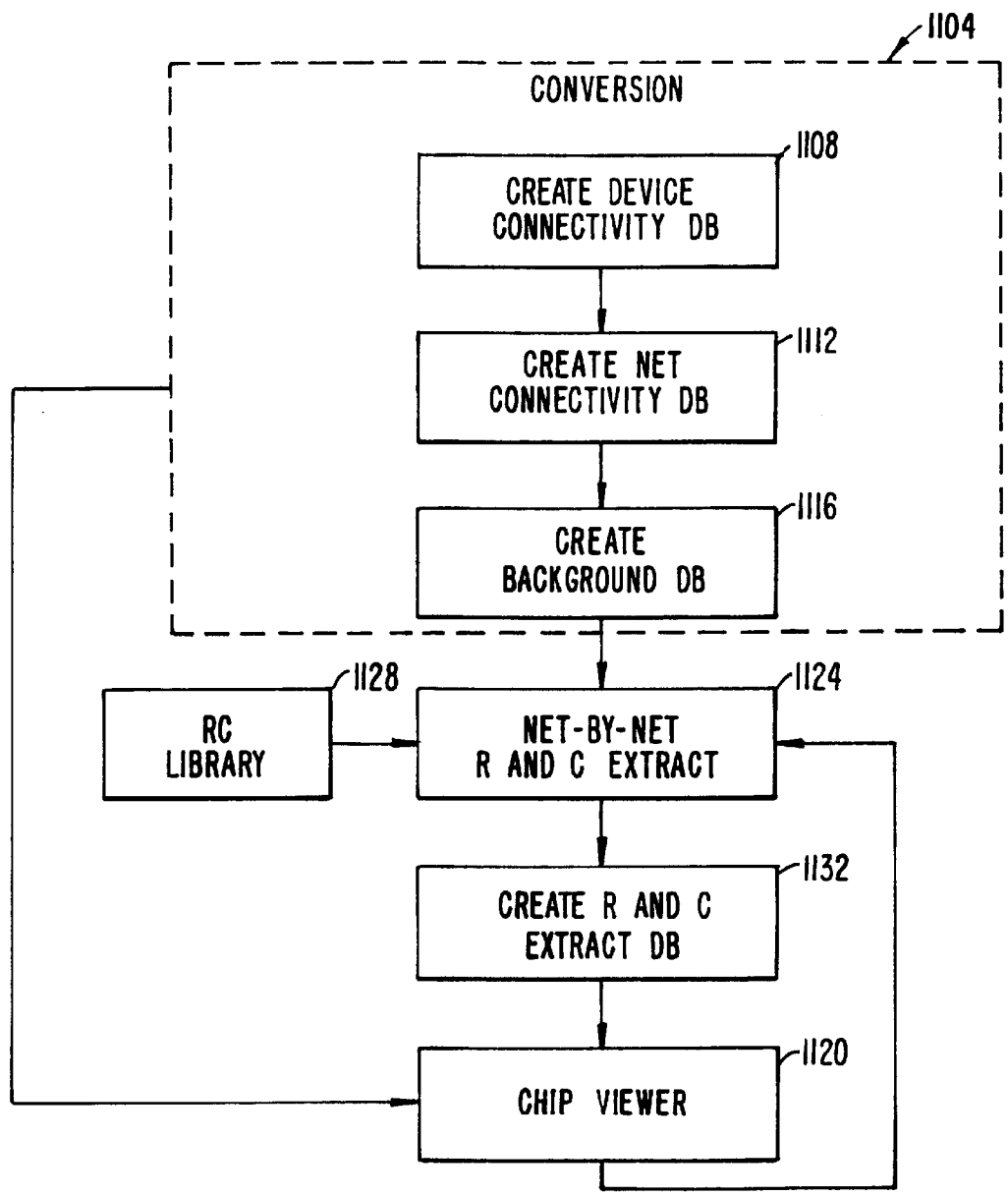
FIG. 11 is a flow diagram of the overall layout parasitics extraction system of the present invention.

FIG. 11 is an overall flow diagram of the layout parasitics extraction method of the present invention. The flow in FIG. 11 may be performed on a general-purpose computer, such as the system shown in FIGS. 9 and 10, or computing machine specially adapted for layout parasitics extraction. For example, the ARCADIA™ source code in C++ language in the microfiche appendix is an implementation of an embodiment of the present invention for a general-purpose computer.

In the design of an integrated circuit, a user creates a circuit schematic and a layout for an integrated circuit. The circuit schematic is contained on a circuit schematic database, while the layout is a layout database. The circuit schematic database may be in a netlist format, which contains circuit elements interrelated by net. The layout database contains the geometries, polygons, layers, and other features of the layout of the integrated circuit. A common layout database format is GDSII.

A first step in the layout parasitics extraction method of the present invention is conversion 1104. Conversion 1104 generates a connectivity-based database where geometries of the layout are referenced and interrelated by the nets and circuit elements of the circuit schematic. More specifically, geometries are referenced to their corresponding nets and circuit elements in the circuit schematic.

In one embodiment of the invention, conversion 1104 starts with a layout-versus-schematic (LVS) database. An LVS database is a database resulting from a layout-versus-schematic check. During an LVS check, a layout is checked for consistency with a corresponding circuit schematic. The LVS check process forms circuit elements and nets from the layout. The LVS check process creates an LVS database where these circuit elements and nets from the layout are organized by the geometries of the layout. For example, referring to FIG. 5, an LVS database may contain a net comprised of polysilicon conductor 556. This net would be referenced by the layout coordinates of polysilicon conductor 556. In other embodiments of the present invention, a database such as an LVS-type database may be created directly, without going through an LVS process.

Using the schematic database and LVS database, conversion 1104 generates a connectivity-based database of geometries of the layout. The connectivity-based database contains circuit elements and nets of the circuit schematic, which are organized and referenced by geometries of the layout. More specifically, in one embodiment, the connectivity-based database contains nets of the circuit schematic, which are referenced to and organized by geometries of layout. The nets may be specified by net name or net number. The geometries may be specified by coordinates.

Furthermore, the connectivity-based database may be contained in more than one database file. For example, in the embodiment shown in FIG. 11, conversion 1104 creates a device connectivity database 1108, a net connectivity database 1112, and a background database 1116. The device connectivity database 1108 is a database of devices of the integrated circuit organized by net. The net connectivity database 1112 is a database of nets of the integrated circuit organized by connections. The background database 1116 is a database of environment information regarding structures such as overlaps and spacing of the geometries of the integrated circuit. These three databases collectively comprise a connectivity-based database of the present invention.

After conversion 1104, a user may use chip viewer 1120 to view the layout or circuit schematic of the integrated circuit on a graphics display. Chip viewer 1120 uses the device conductivity database generated in conversion 1104. Chip viewer 1120 may provide an interactive graphics display of nets, trees, and blocks of design in a connectivity-based database. For example, a user can select layers of the layout, nets, and circuit elements to view. Chip viewer 1120 also automatically selects complex clock trees and global clock signals distributed to many circuits. Moreover, chip viewer 1120 provides full zoom and pan capabilities. A user can also select a net of the circuit schematic and view extracted resistance and capacitance values for that net. For example, with chip viewer 1120, a user can select a net or nets graphically for extraction by net-by-net R and C extract 1124. A user may also select a net by entering a schematic net name and layout net number, or schematic block name.

After conversion 1104, instead of using chip viewer 1120, a user may proceed to net-by-net R and C extract 1124. Using the connectivity-based database generated during conversion 1104, net-by-net R and C extract 1124 extracts the parasitic resistances (R) and parasitic capacitances (C) of the layout. Net-by-net R and C extract 1124 extracts the parasitics in a net-by-net fashion. More example, net-by-net R and C extract 1124 extracts parasitics for a net, then proceeds to another net, and so forth until the desired nets are extracted.

Net-by-net R and C extract 1124 allows extraction at various levels, including net, cell, block, and entire integrated circuit levels. For example, a user may extract selected nets—nets selected using chip viewer 1120. Furthermore, when extracting at a level comprising repeated cells (e.g., block and entire integrated circuit levels), net-by-net R and C extract 1124 will use parasitics data previously determined so that each block will only be extracted once. For example, for FIG. 8, net-by-net R and C extract 1124 will only extract layout parasitics for one box 804, and use these extracted values for the other boxes 804, since boxes 804 contain the same layout.

In addition to a connectivity-based database, net-by-net R and C extract 1124 also utilizes an RC library 1128, which comprises files, definitions, and libraries including information on the process technology and parasitics for predefined structures. For example, RC library 1128 includes information on polysilicon resistance, n-well resistance, metal-1 resistance, polysilicon-to-metal-1 capacitance, overlap capacitance, oxide thickness, and other similar parameters.

Create R and C extract database 1132 creates an R and C extract database of the parasitic resistance and capacitance values extracted during net-by-net R and C extract 1124. Chip viewer 1120 also allows viewing of data in the R and C extract database 1132. For example, a user can view the extracted resistance and capacitance values graphically.

Furthermore, other software, including software from third parties, may use the R and C extract database 1132 to provide other data pertinent for the design and fabrication of integrated circuits. In one embodiment, the R and C extract database 1132 may be back annotated into the circuit schematic to allow circuit simulation with extracted parasitics. Other examples include clock skew analysis, power net analysis, electromigration analysis, characterization of cells, coupling effects between digital and analog sections of mixed signal integrated circuits, critical path analysis, timing analysis, and multiple signal race condition analysis.

Figure 12:
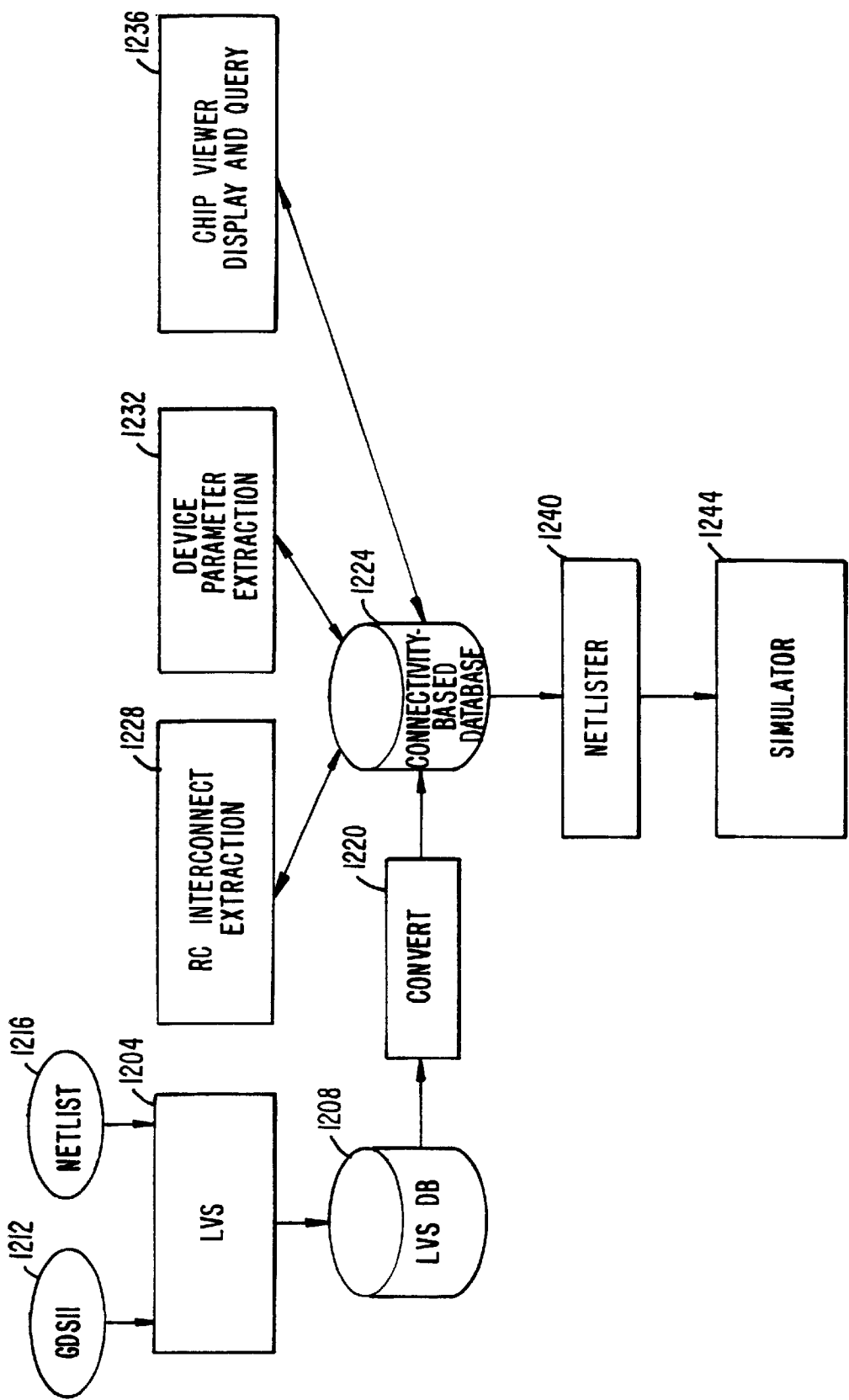
FIG. 12 is a flow diagram of another embodiment of the overall layout parasitics extraction system of the present invention.

FIG. 12 is an overall flow diagram of an architecture of the parasitics extraction system of the present invention. In this embodiment, LVS process 1204 generates an LVS database 1208 from a layout in a GDSII file 1212 and circuit schematics in a netlist file 1216. Convert 1220 converts the LVS database 1208, where nets of an integrated circuit are organized by geometries of the layout, into a connectivity-based database 1224, where nets from geometries of the layout are organized by nets of the circuit schematic. Using connectivity-based database 1224, RC interconnect extraction 1228 extracts layout parasitics for selected nets or an entire integrated circuit. Further, RC interconnect extraction 1228 creates an R and C extract database containing the extracted parameters. Also, using connectivity-based database 1224, device parameter extraction 1232 will extract device parameters such as, among others, width, length, area of source, area of drain, perimeter of source, perimeter of drain, net resistance of drain, and net resistance of source.

Chip viewer 1236 is used to display and query the connectivity-based database 1224 and is similar to chip viewer 1120 of FIG. 11. A user may use chip viewer 1236 to view the layout or circuit schematic of the integrated circuit on a graphics display. In one embodiment, chip viewer 1236 provides an interactive graphics display of nets, trees, and blocks in the connectivity-based database. The user can view selected layers, net paths, signal paths, and blocks. Chip viewer 1236 also automatically selects complex clock trees. Moreover, chip viewer 1236 provides full zoom and pan capabilities. A user can also view extracted resistance and capacitance values. Furthermore, with chip viewer 1236, a user can graphically select a net or nets for extraction by RC interconnect extraction 1228. The user may also select a net by entering a schematic net name and layout net number, or schematic block name.

From connectivity-based database 1224, netlister 1240 will generate a netlist-format file of the extracted parasitic resistance and capacitance values. In this format, the extracted parasitic values may be back annotated into the circuit schematic for simulation and analysis of the circuit by a simulator 1244. Also, other applications software may use the netlist format file to produce other integrated circuit analyses including clock skew analysis, power distribution analysis, timing analysis, electromigration analysis, coupling analysis, power ground bounce analysis, and inductance analysis.

Figure 13:
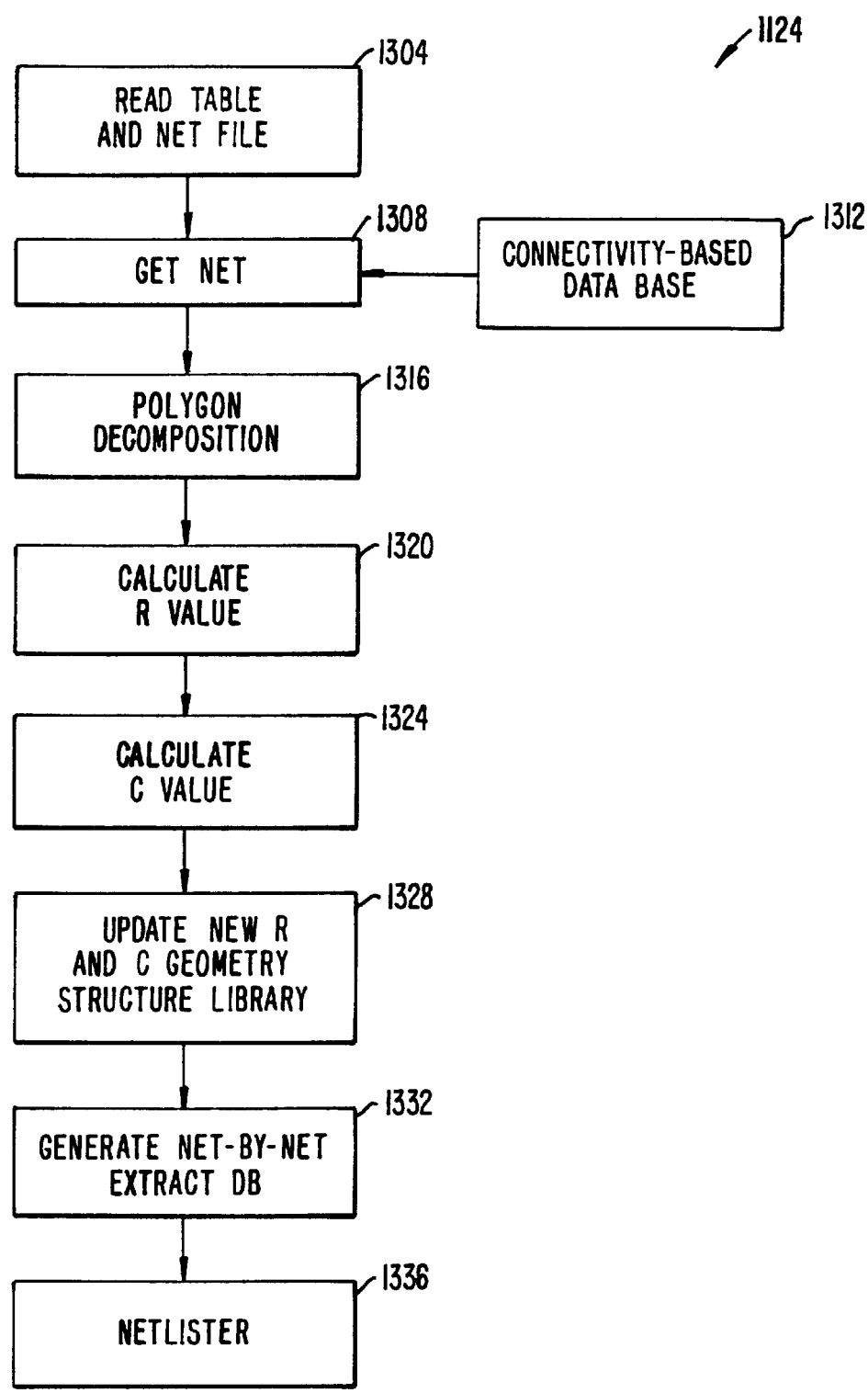
FIG. 13 is a flow diagram of the net-by-net resistance and capacitance extraction method of the present invention.

FIG. 13 is a more detailed flow diagram of the net-by-net R and C extract 1124 step of FIG. 11. Read table and net file 1304 reads information about the integrated circuit process, predefined structures, and previously extracted structures. This information can be retrieved from RC library 1128.

After read table and net file 1304, the next step is get net 1308, which gets the structures connected to a net or selected net. A user may have previously selected this net. The user may make this selection, for example, by using chip viewer 1120 of FIG. 11 as described above. Get net 1308 uses a connectivity-based database 1312 that was created in steps 1108 and 1112 of FIG. 11 (e.g., comprising device and net conductivity databases). Get net 1308 "traces" through a net in connectivity-based database 1312, finding and preparing layout geometries for parasitics extractions.

After a particular net and its related structures are designated for extraction, the next step is polygon decomposition 1316 where a particular geometry, polygon, or structure is broken or divided into smaller, easier-to-extract pieces. For example, a long rectangular polygon is broken down into a plurality of smaller squares or rectangular structures. The locations where a polygon is broken up are referred to as breakpoints. In later steps of the flow in FIG. 13, the resistance and capacitance values are extracted and calculated for these smaller polygons. These differential segments are than added to determine the layout parasitics (e.g., resistance or capacitance) for the structure.

In order to properly account for equipotential lines of current, special decomposition techniques should be used to break up irregularly shaped polygons. Irregularly shaped polygons are generally those that are not square or rectangular. For example, an L-shaped turn, corner, or junction in a polysilicon line would form an irregularly shaped polygon. In an embodiment of the present invention, for irregularly shaped polygons, polygon decomposition 1316 selects breakpoints a distance W/2 in opposite directions from the irregular polygon. "W" is the width of the polygon. In the end, the decomposed polygon includes the irregular polygon and two W/2 portions. For example, for an L-shaped turn, the decomposed polygon would include the L-shaped turn, a first portion W/2 from the turn, and a second portion W/2 from the turn. When extracted, this decomposed polygon will properly account for equipotential lines of current. This method of polygon decomposition also properly accounts for equipotential lines of current for other types of junctions having a plurality of branches, such as T-junctions.

In another embodiment of the present invention, polygon decomposition 1316 decomposes nets and structures into smaller sections or pieces to allow for distributed RC modeling of the layout parasitics. In practice, long nets do not have a simple parasitic resistance and parasitic capacitance component, but rather resistances and capacitances distributed along the length of the net. In order to accurately model distributed RC, nets must be broken up into smaller sections and extracted individually. Generally, the smaller the decomposed sections, the greater the accuracy of the distributed RC model. The distributed RC modeling of the present invention allows for more accurate modeling of layout parasitics. Distributed RC modeling of the present invention is discussed further below.

After polygon decomposition 1316, the next step is to calculate R value 1320 which determines the parasitic resistance value of the selected structure or net. Calculate R value 1320 either finds a parasitic resistance value in a lookup table of previously extracted structures or calculates a value. Parasitic resistance determination is discussed further below. Calculate C value 1324 determines the parasitic capacitances of the selected structure or net. Calculate C value 1324 either finds a parasitic capacitance value in a lookup table of previously extracted structures or calculates a value. Parasitic capacitance determination is discussed further below. In other embodiments of the present invention, calculate C value 1324 may precede calculate R value 1320.

Update new R and C geometry structure library 1328 updates the lookup tables of previously extracted parasitic resistances and capacitances with new structures not already in these lookup tables. For example, a lookup table for parasitic resistances is contained in an R geometry structure library. And a lookup table for parasitic capacitances is contained in a C geometry structure library. With each iteration through net-by-net R and C extract 1124, new structures are learned and added to the lookup tables. In subsequent iterations, structures that match those in the lookup tables will not need to be calculated. Instead, values from the lookup tables will be used. Since calculation of parasitics values takes more computing time than searching and selecting a value from a lookup table, this feature of the present invention speeds execution of the routine.

Generate net-by-net extract database 1332 generates a connectivity-based database, which may be referred to as the net-by-net extract database, containing the extracted parasitics. The extracted parasitics parameters are organized by nets of the circuit schematic. Netlister 1336 is similar to netlister 1240 of FIG. 12. Netlister 1336 uses this net-by-net extract database to back annotate the parasitics extracted back into the circuit schematic database to allow circuit simulation of the integrated circuit with the extracted parasitics. Furthermore, using the net-by-net extract database, netlister 1336 can generate a netlist format file that can be used by software, possibly from a third-party, to provide other types of integrated circuit analyses such as clock skew analysis, power net analysis, electromigration analysis, characterization of cells, coupling effects between digital and analog sections of mixed signal integrated circuits, critical path analysis, timing analysis, and multiple signal race conditions analysis.

Figure 14:
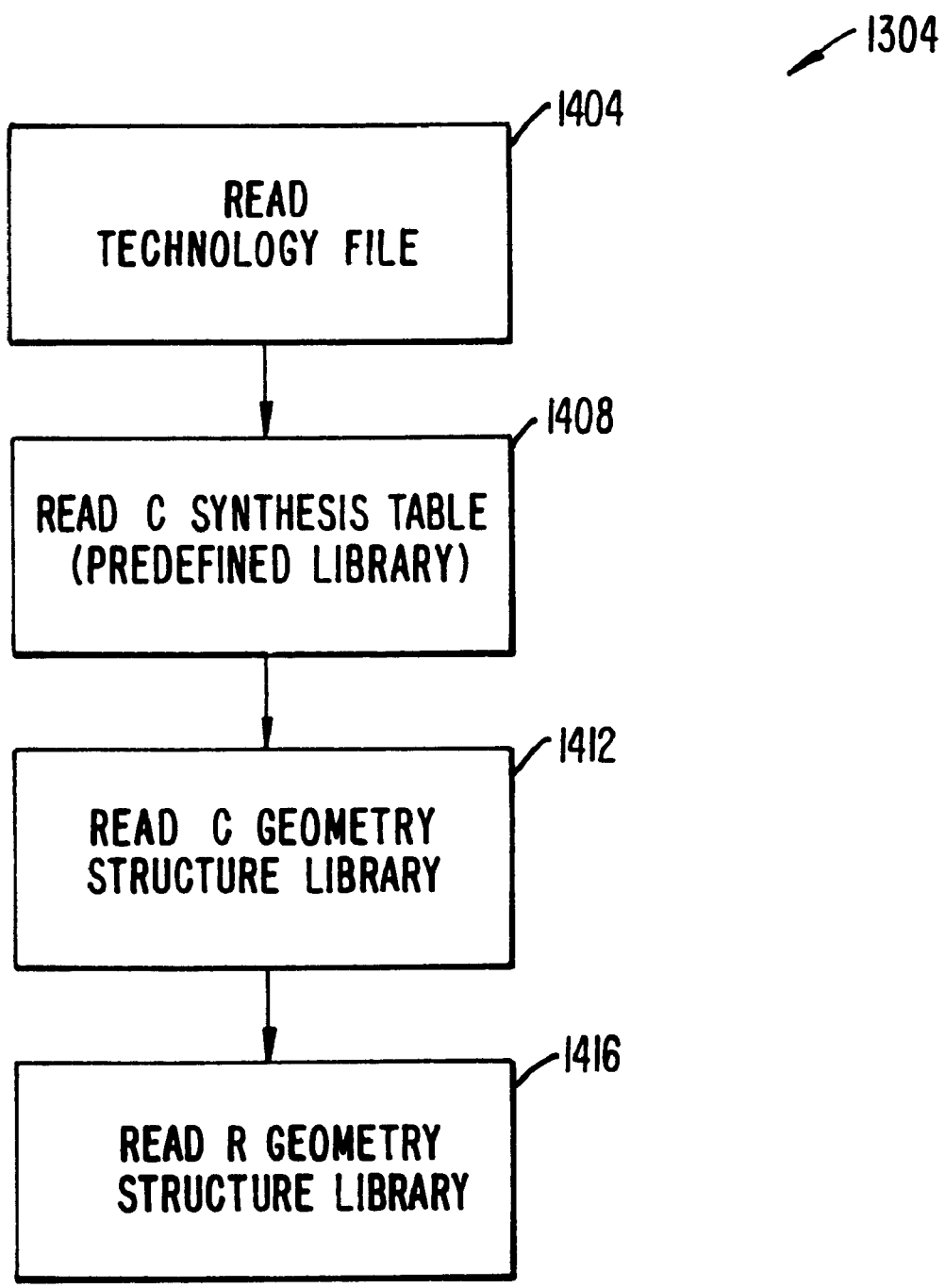
FIG. 14 is a flow diagram of the read table and net file method of the present invention.

FIG. 14 shows a more detailed flow diagram of read table and net file 1304 of FIG. 13. Read technology file 1404 reads a process technology file containing information about the parameters of the particular process used to fabricate the integrated circuit. For example, for an interconnection or conductor layer, a user may specify the thickness of that layer, sheet resistance, and capacitance environment range. As a further example, for a MOS transistor, a user may specify the sheet resistance of the p-diffusion and the oxide thickness of the gate. The layout extraction system of the present invention uses the parameters in the process technology file to calculate the layout parasitics. For example, if the layout extraction system finds 5 squares in a polysilicon line and determines from the process technology file that polysilicon has 25 ohms per square, then there will be 125 ohms of resistance.

Read C synthesis table 1408 reads a C synthesis table, which contains predefined structures where capacitance values have already been calculated. The C synthesis library is a lookup table, which is consulted before calculating the capacitance of a particular structure. If the structure is found in the C synthesis table, then the parasitic capacitance value found in the table will be used, rather than calculating a value. As discussed earlier, this speeds up execution of the layout extraction system of the present invention.

Read C geometry structure library 1412 reads a C geometry structure library, which is a lookup table containing previously extracted capacitance values. The C geometry structure library is similar to the C synthesis table because both are lookup tables which are consulted before calculating a parasitic capacitance value. However, newly calculated parasitic capacitance structures are added to the C geometry structure library.

Read R geometry structure library 1416 reads an R geometry structure library, which is a lookup table containing previously extracted parasitic resistance values. R geometry structure library is similar to the C geometry structure library, but contains parasitic resistance values instead. The R geometry library is consulted before calculating a parasitic resistance value. Furthermore, newly calculated parasitic resistance values structures are added to the R geometry structure library.

Figure 15:
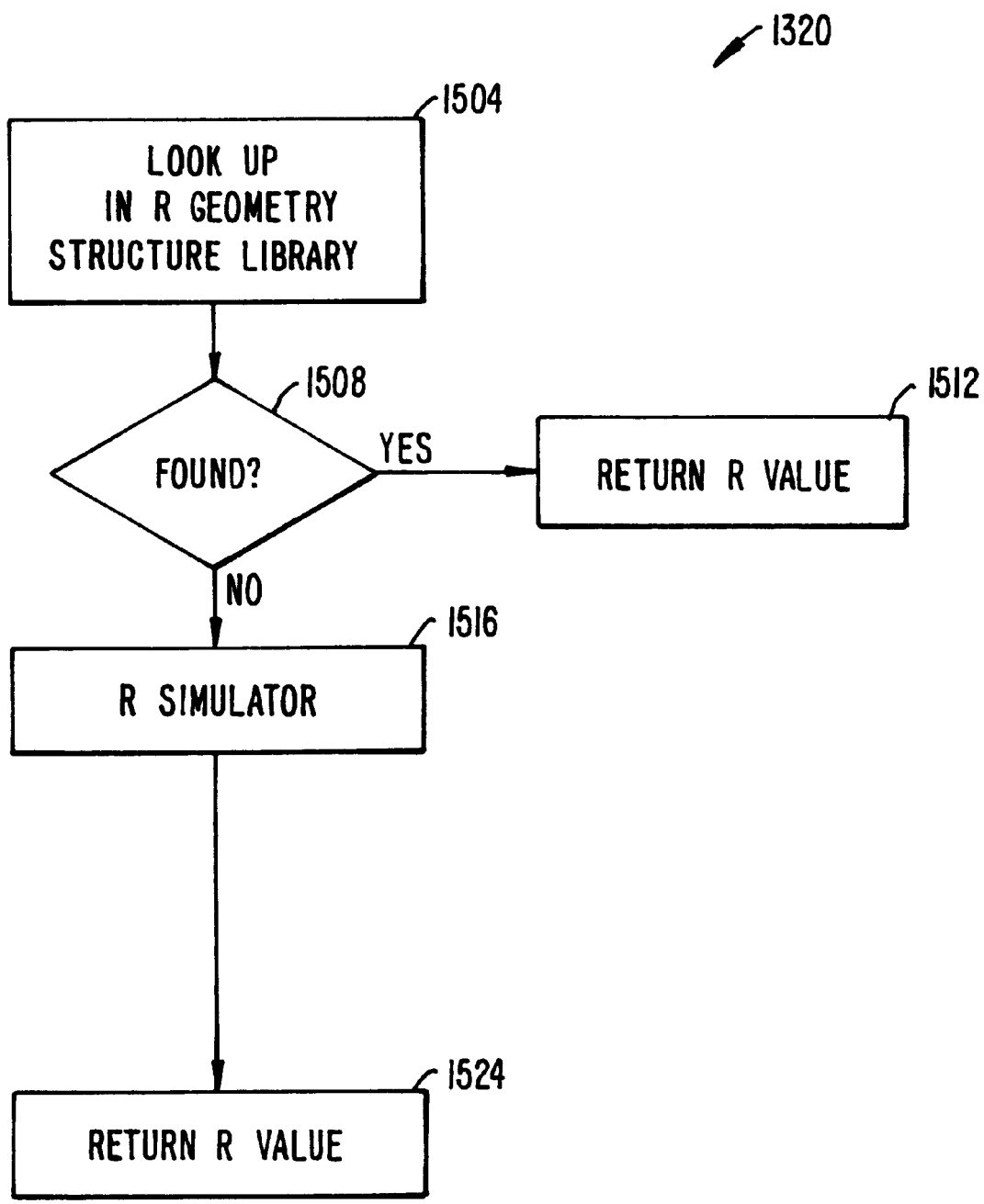
FIG. 15 is a flow diagram of the resistance value calculation method of the present invention.

FIG. 15 shows a more detailed flow diagram of calculate R value 1316 of FIG. 13. First, lookup in R geometry structure library 1504 consults the R geometry structure library 1416 of FIG. 14. If the selected structure, geometry, or net is found (i.e., found 1508) in the R geometry structure library 1416, this value is used (i.e., return R value 1512); no further extractions or calculations need to be performed.

If the selected geometry, structure, or net is not found (i.e., found 1508), however, R simulator 1516 calculates the parasitic resistance of the selected geometry, structure, or net. The calculation of parasitic resistance may include totalling the number of squares of resistance and multiplying this by the resistance per square of the material. Furthermore, as discussed earlier, the simulator 1516 will take into account equipotential lines of current and irregularly shaped polygons.

After R simulator 1516, the calculated parasitic resistance value is returned (i.e., return R value 1524). In the main net-by-net R and C extract 1124 flow, the R geometry structure library 1416 will be updated with the parasitic resistance value calculated by R simulator 1516. This occurs during update new R and C geometry structure library 1328. However, in other embodiments of the present invention, this update may occur, instead, in the calculate R value 1320 flow between the R simulator 1516 and return R value 1524 steps. In subsequent runs through R value 1320, these parasitic resistances for these structures will be found in the R geometry structure library 1416 during lookup in R geometry structure library 1504. Therefore, R simulator 1516 does need to recalculate these previously extracted parasitics. This improves the execution speed of the layout extraction system.

Figure 16:
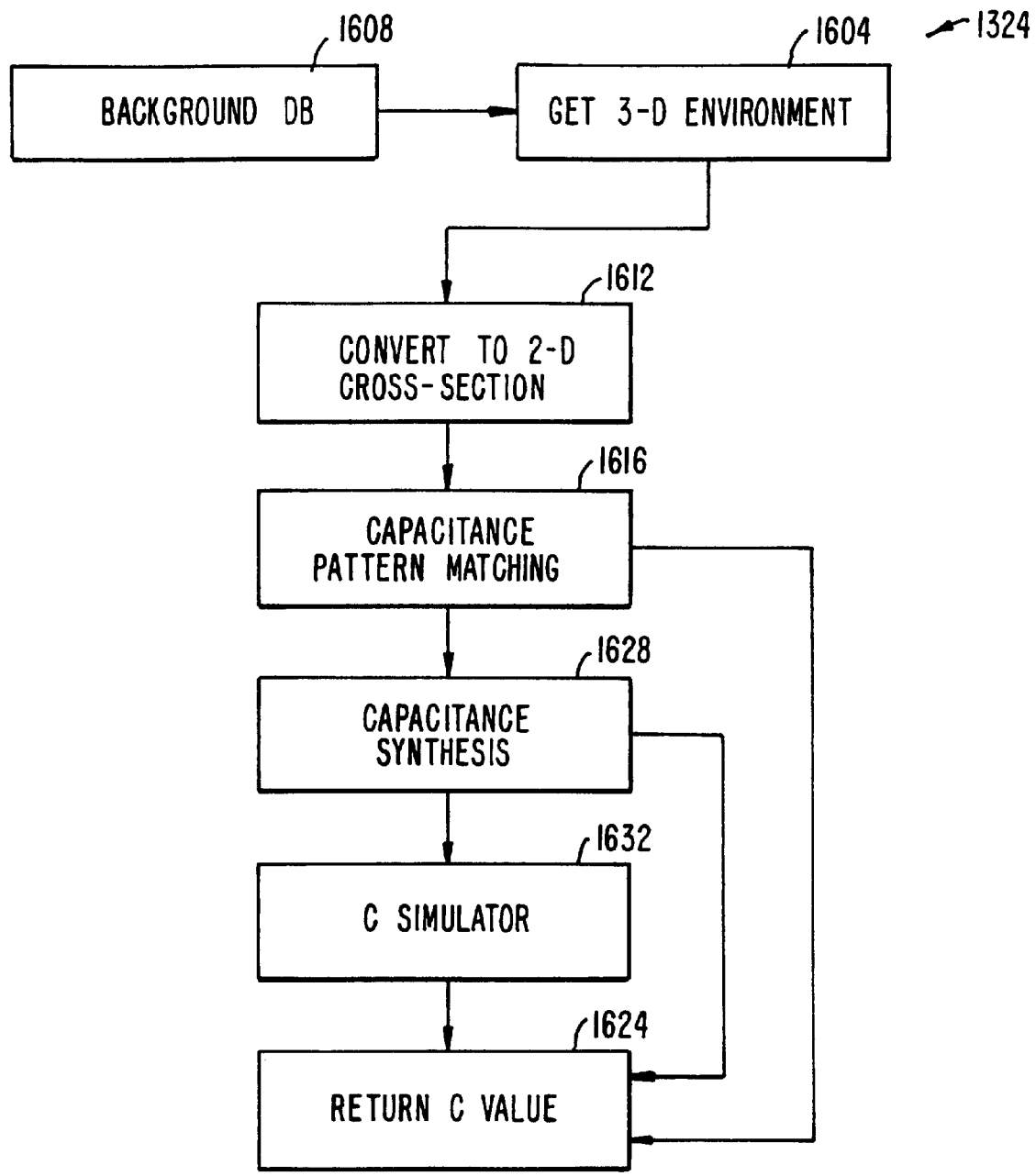
FIG. 16 is a flow diagram of the capacitance value calculation method of the present invention.

FIG. 16 shows a flow diagram of calculate C value 1324 of FIG. 13. Get 3D environment 501 gets the three-dimensional (3D) environment information for the selected geometry, structure, or net. For parasitic capacitance, lateral, fringe, and area capacitances all contribute to the parasitic capacitance of a particular structure. For example, if there are three layers of metal interconnect surrounding a selected structure, each of these metal interconnect layers contribute some amount of lateral and fringe capacitance to the selected structure. Parasitic capacitance for a structure generally cannot be obtained solely from a single layer of a layout database.

Get 3D environment 1604 determines which layers contribute to the parasitic capacitance (i.e., including fringe, area, and lateral effects) of a selected structure. Get 3D environment 1604 uses the background database 1608 (i.e., background database 1116 of FIG. 11), which contains three-dimensional information about the geometries and structures surrounding a selected structure. This information is referred to as the 3D environment.

In the present invention, get 3D environment 1604 makes a determination of which geometries or structures contribute relatively weakly to the parasitic capacitance and excludes these from consideration. For example, if there are three layers of metal interconnect surrounding a selected structure, each of these metal interconnect layers contribute some amount of lateral and fringe capacitances, but one of these metal interconnects may be so much closer to the selected structure that it clearly dominates the parasitics. In this case, get 3D environment 1604 will "throw away" or not consider the capacitance effects from the other two metal interconnects because their values' effects are comparably minimal. A threshold for deciding whether to consider a structure as part of an environment is if the parasitic capacitance contribution of that structure is less than one-tenth of the parasitic capacitance contribution of another structure. In other embodiments, capacitances less than one-hundredth of the dominant capacitance will not be considered. By only considering selected, relatively substantial parasitic capacitances, the present invention improves execution speeds, since only relevant parasitic capacitances are considered.

After the particular structures that contribute or effectively contribute capacitance to a selected structure are determined, convert to 2D cross section 1612 converts this three-dimensional (3D) environment information into a two-dimensional cross-sectional structure. More specifically, convert to 2D cross section 1612 finds the cross section or a "side view" for the particular structure.

The get 3D environment 1604 and convert to 2D cross section procedures are sometimes referred to as quasi-3D capacitance modeling. This is a process of determining capacitances based on a compilation of orthogonal 2D cross sections of an integrated circuit. A more detailed description of this technique is given below. Furthermore, as part of convert to 2D cross section 1612, a 2D capacitance geometry statistical difference process may also be used to check the accuracy of the quasi-3D capacitance modeling. In this process, the inaccuracies of a purely 2D analysis of the capacitance are compared to the true 3D environment. This is used to test the accuracy of the resulting 2D model.

Capacitance pattern matching 1616 compares the cross-sectional structures against the C geometry structure library 1412 of FIG. 14. The C geometry structure library 1412 contains parasitic capacitance values for previously extracted structures. If the cross-section structure is found in the C geometry structure library 1412, processing proceeds to return C value 1624, and this parasitic capacitance value will be used.

However, if no match is found, the next step is C synthesis 1628. This step refers to the process of modeling parasitic capacitance effects, but excluding the effects of corners, bending, crossover, and arbitrary shapes. C synthesis calculates a "signature." This signature is unique for a specific structure of the layout. C synthesis 1628 consults a C synthesis table 1408 of FIG. 14, containing parasitic capacitances for predefined structures having predefined signatures. If the calculated signature is found in the C synthesis table 1408, then the capacitance value for the predefined structure with the same signature will be returned and used (i.e., return C value 1624).

Even if an exact signature match is not found, the signature may substantially match a signature in the C synthesis table 1408. A substantial signature match may be a ninety percent or greater match. In other embodiments, the degree of signature correspondence may be eighty percent or greater. For substantial signature matches, C synthesis 1628 will calculate a parasitic capacitance value for that selected structure. More specifically, C synthesis 1628 performs this calculation by making an interpolation from structures with substantially similar signatures in the C synthesis table 1408. This interpolated value is returned and used (i.e., return C value 1624). In other embodiments of the present invention, capacitance synthesis 1628 may precede capacitance pattern matching 1616.

C simulator 1632 is used when there is no substantial signature match and the structure is not found in the C geometry structure library 1412. C simulator 1632 calculates the parasitic capacitance value for the structure through capacitance modeling and simulation techniques. Depending on the desired degree of accuracy, C simulator 1632 will perform one or more iterations. The capacitance modeling or simulation may also be performed by third party software. C simulator 1632 may use a field solver when critical capacitances are being modeled, although field solvers will generally slow down execution speed.

After C simulator 1632, the calculated parasitic capacitance value is returned (i.e., return C value 1624). In the main net-by-net R and C extract 1124 flow, the C geometry structure library 1412 will be updated with the parasitic capacitance value calculated by C simulator 1632. This occurs during update new R and C geometry structure library 1328. However, in other embodiments of the present invention, this update may occur, instead, in the calculate C value 1324 flow between the C simulator 1632 and return C value 1624 steps. In subsequent runs through calculate C value 1324, these parasitic capacitances for these structures will be found in the C geometry structure library 1412 during capacitance pattern matching 1616. Therefore, C simulator 1632 does need to recalculate these previously extracted parasitics, improving the execution speed of the layout extraction system.

Figure 17A:
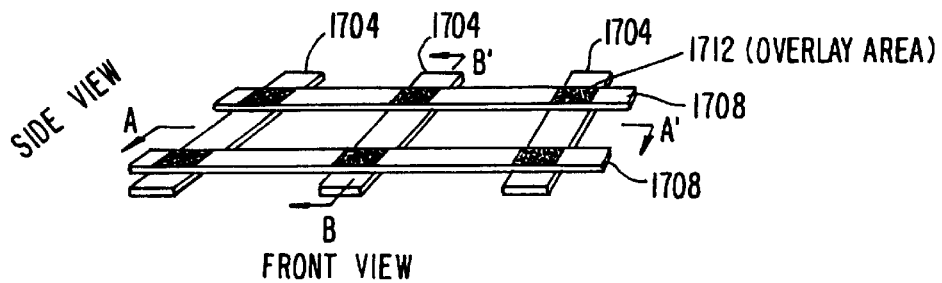
FIGS. 17A and 17B are graphical illustrations of the capacitance value calculation method of the present invention.
Figure 17B:
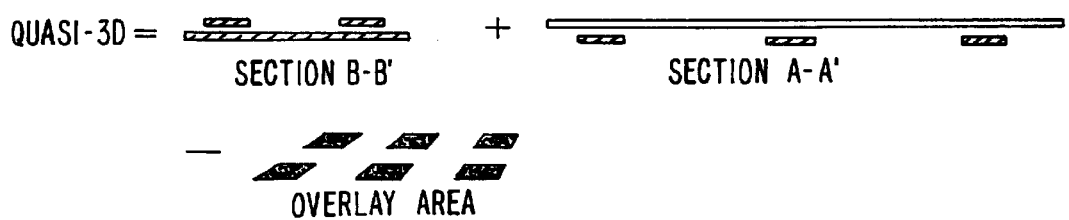

FIGS. 17A and 17B show graphical representations of the calculate C value 1324 procedure of the present invention. FIG. 17A shows a result of get 3D environment 1604. There are a plurality of first structures 1704 extending in a first direction. There are a plurality of second structures 1708 extending in a second direction, above the first structures 1704. A plurality of overlay areas 1712 result from intersections of first structures 1704 and second structures 1708.

FIG. 17B shows the covert to 2D cross-section routine 1612. The capacitances are determined for a cross-section of the 3D structure in a first direction (side view section B–B'). These are combined with the capacitances for a cross-section of the 3D structure in a second direction (front view section A–A'). This second direction is orthogonal or transverse to the first direction.

FIGS. 18 through 22 are five functional blocks of a sample technology file. The technology file is read during read technology file 1404 of FIG. 14. These files include basic information about the semiconductor process and additional information about generating resistance and capacitance models. In one embodiment, there are five functional blocks of the technology file: System commands (see FIG. 18), library commands (see FIG. 19), display commands (see FIG. 20), technology commands (see FIG. 21), and connectivity commands (see FIG. 22).

System commands (see FIG. 18) are those commands that specify parameters such as the file names to extract and the output file names. Library commands (see FIG. 19) are the block of the technology file used to specify the R and C geometry model library files. Display commands (see FIG. 20) are the block of the technology file used to define how the layers in the layout database correspond to the process layers (e.g., p-diffusion, contact, metal 1, metal 2). As discussed above, the layout database is typically in GDSII format. Technology commands (see FIG. 21) are the block of the technology file used to specify physical process parameters such as contact resistance, oxide thickness, metal thickness, and p-diffusion resistance. Connectivity commands (see FIG. 22) are the block of the technology file used to specify the sequence of semiconductor interconnect layers from bottom to top and defines how these layers connect with each other.

Figure 23A:
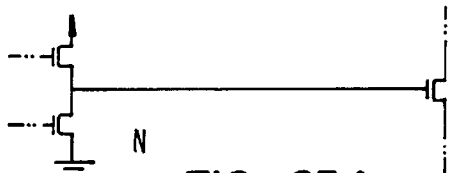
FIGS. 23A to 23J show circuit diagrams for ten network reduction models of the present invention.
Figure 23B:
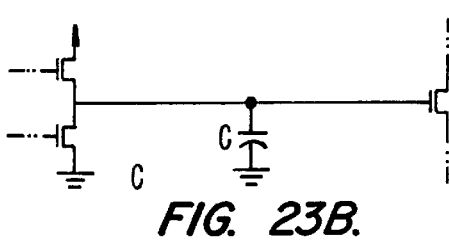
Figure 23C:
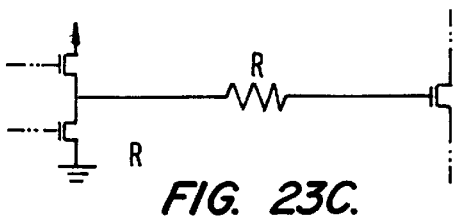
Figure 23D:
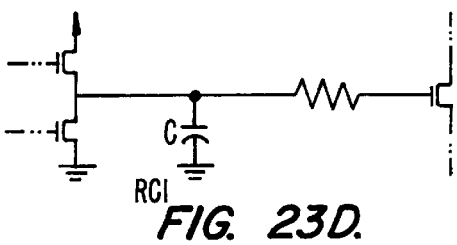
Figure 23E:
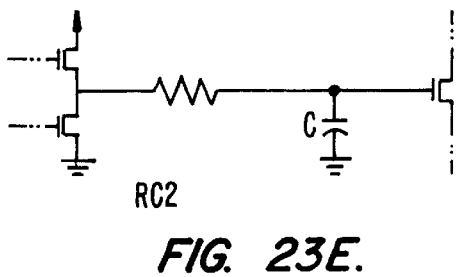

FIGS. 23A to 23J show distributed network reduction models of the present invention. Using a connectivity-based database, the present invention can extract lumped distributed RC networks. Lumped distributed RC networks allow for more accurate modeling of layout parasitics, especially for long nets. FIGS. 23A through 23J show circuit diagrams for ten network reduction models of the present invention. FIGS. 23A through 23E are useful for extremely simple or short nets. FIG. 23A shows an N model. This model does not have a resistance (R) or capacitance (C) in the net between the circuit elements. FIG. 23B shows a C model. In this model, a C to ground (representing the total capacitance of the net) is coupled to the net. FIG. 23C shows an R model, where there is an R (representing the total resistance) in the net, between the circuit elements. FIG. 23D shows an RC1 model. In this model, a C to ground is coupled before a R between the circuit elements. FIG. 23E shows an RC2 model. In this model, a C to ground is coupled after a R between the circuit elements. These models in FIGS. 23A to 23E provide reasonable accuracy at modest computing costs for the simplest and lowest frequency nets.

Figure 23F:
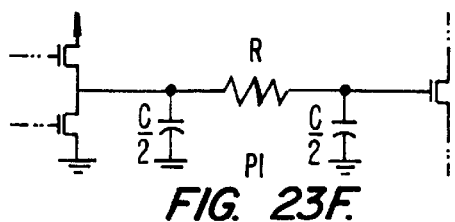
Figure 23G:
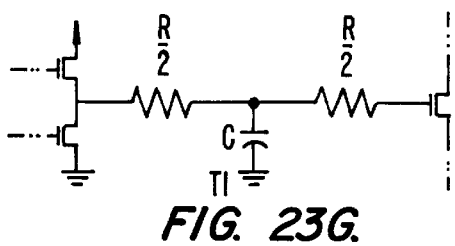
Figure 23H:
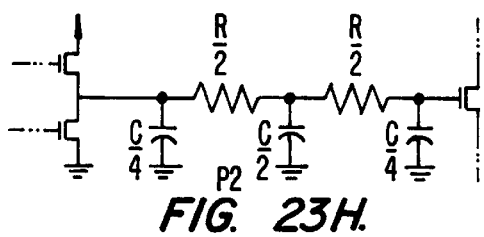
Figure 23I:
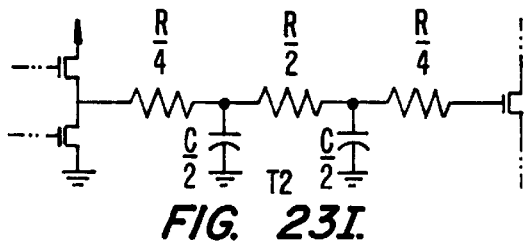

FIGS. 23F to 23J are for more complex and longer nets. FIGS. 23G and 23I are T-network models. FIG. 23G is a T1 model. In this model, a C to ground is coupled between two R/2 circuit elements. FIG. 23I shows a T2 model. In this model, between the circuit elements, there is an R/4 (representing one-fourth the resistance of the net) coupled to an R/2 (representing one-half the resistance of the net), which is in turn, coupled to another R/4. Between each R/4 and R/2 connection is a C/2. At lower frequencies on a net, the T1 model may be used, while at the higher frequencies, the T2 model should be used for greater accuracy.

Figure 23J:
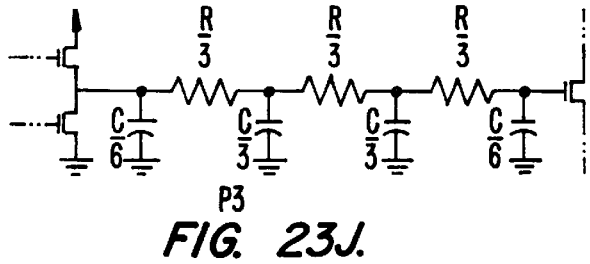

FIGS. 23F, 23H, and 23J are pi-network models. FIG. 23F shows a P1 model. In the P1 model, on either side of an R between the circuit elements is a C/2 to ground. FIG. 23H shows a P2 model, and FIG. 23J shows a P3 model. The P1 model is used for the lowest frequency nets. As the frequency of the signal on a net increases, the P2 or P3 models are used to provide greater accuracy.

Figure 24:
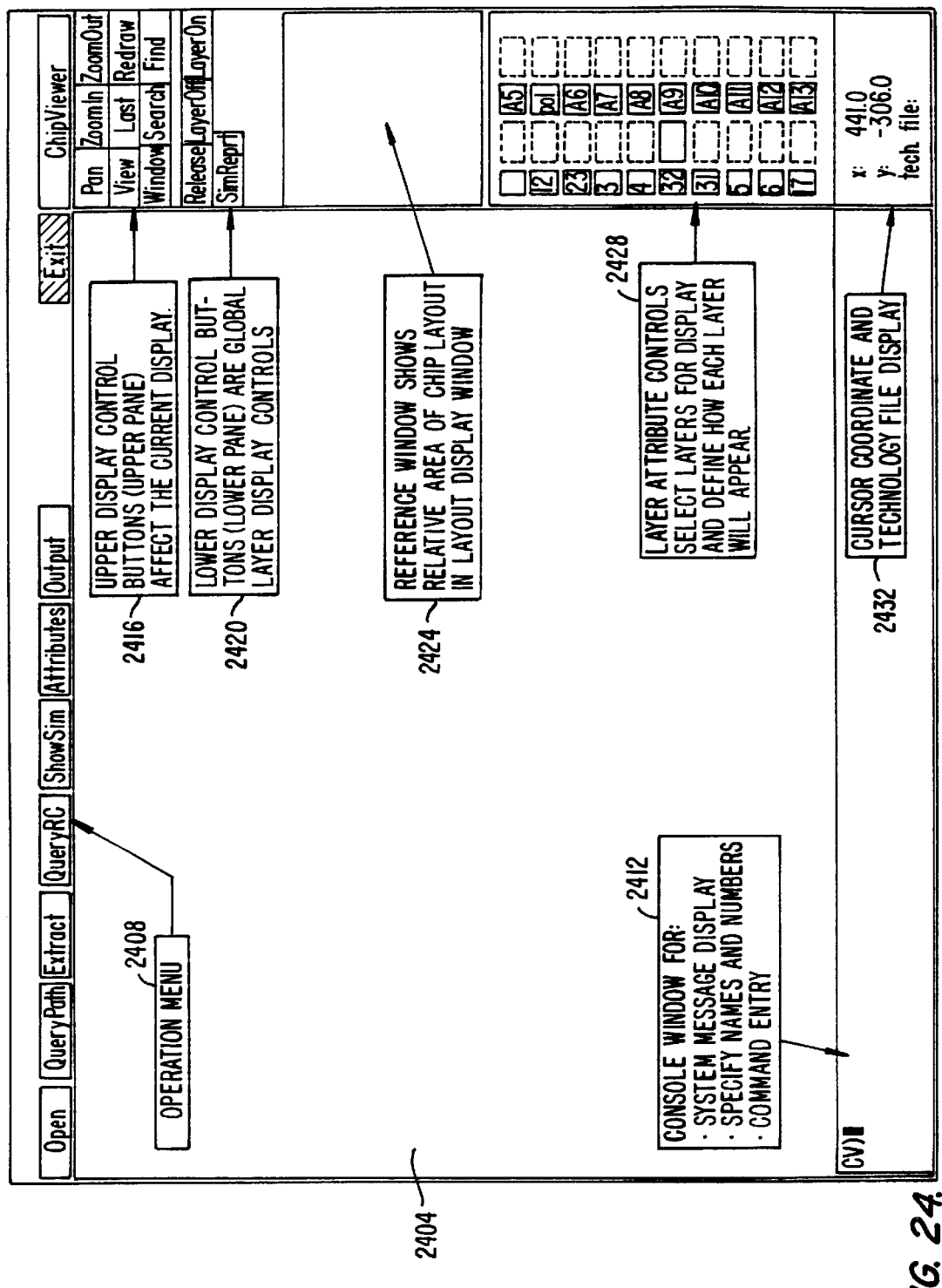
FIG. 24 shows a screen from a chip viewer graphical interface of the present invention.

FIG. 24 shows a screen from a chip viewer 1120 graphical interface of the present invention. Main chip layout display window 2404 can be used to display the circuit schematic or layout of the integrated circuit. A user selects commands from a menu-driven operation menu 2408. Alternatively, a user may type commands into the console window 2412. Console window 2412 is also used to display system messages and specify net names and numbers.

Upper display control buttons 2416 are used to manipulate the current display in the main chip layout display window 2404; the user can pan, zoom in, zoom out, redraw, search, find, view, and perform other such operations on the current display. Lower display control buttons 2420 are global layer display controls to control whether certain layers are shown.

Reference window 2424 shows the chip layout in the main chip layout display window 2404 relative to the entire cell, block, or integrated circuit. Layer attribute controls 2428 selects layers for display and define how each layer will appear. For example,the user may adjust the shading or color. Cursor coordinate and technology file display 2432 shows the current coordinates of the cursor and the name of the technology file being used.

Figure 25:
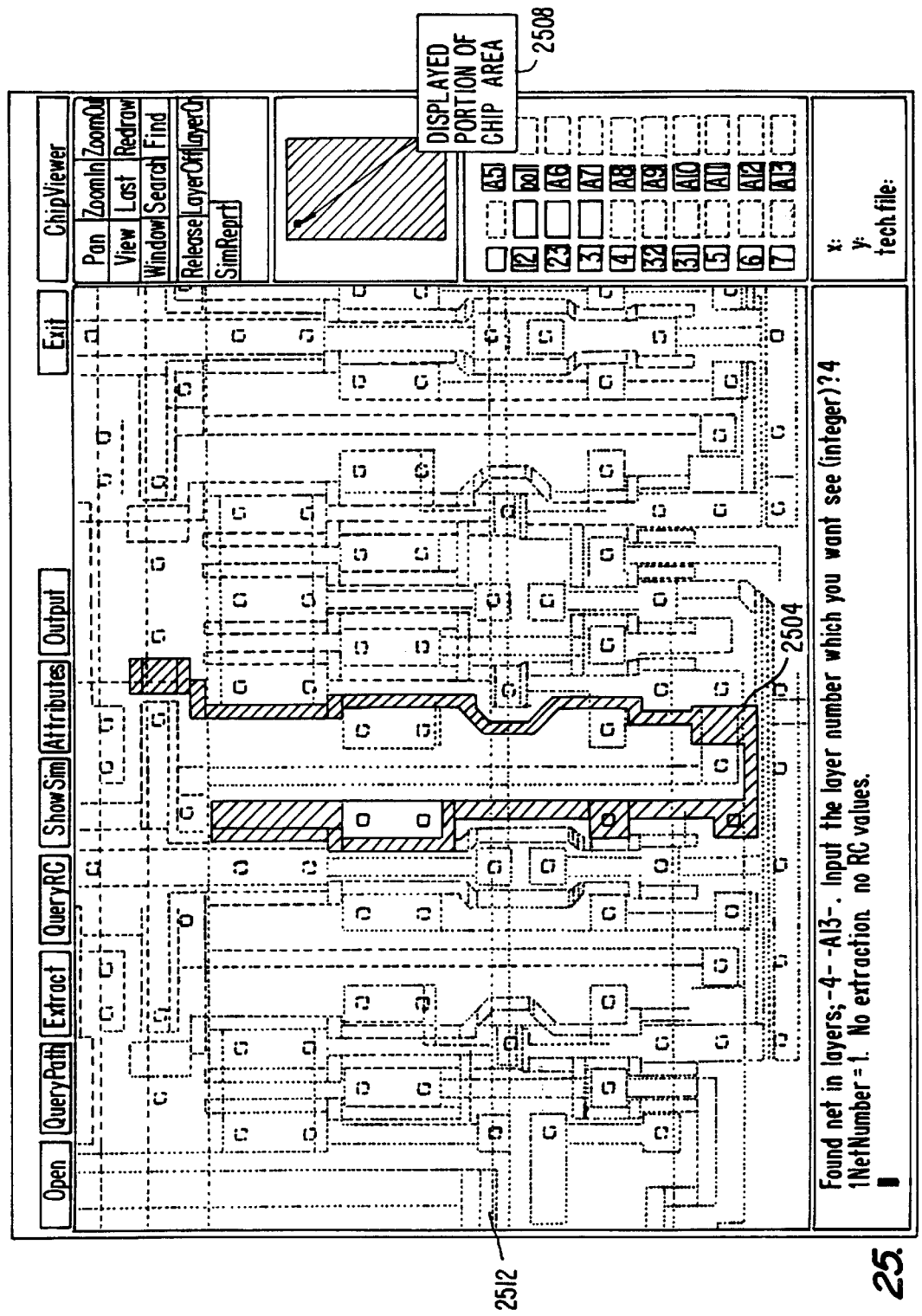
FIG. 25 shows a screen from a chip viewer graphical interface showing a selected net with the surrounding layout.

FIG. 25 shows a screen from a chip viewer 1120 graphical interface showing a selected net 2504 with the surrounding layout. Selected net 2504 is highlighted. The highlighting is selectable. On a color display, this highlighting may be in a white color or other differentiating color. Reference window 2508 shows the portion of the layout displayed portion in the main chip layout display window 2512 in relation to the entire integrated circuit area.

Figure 26:
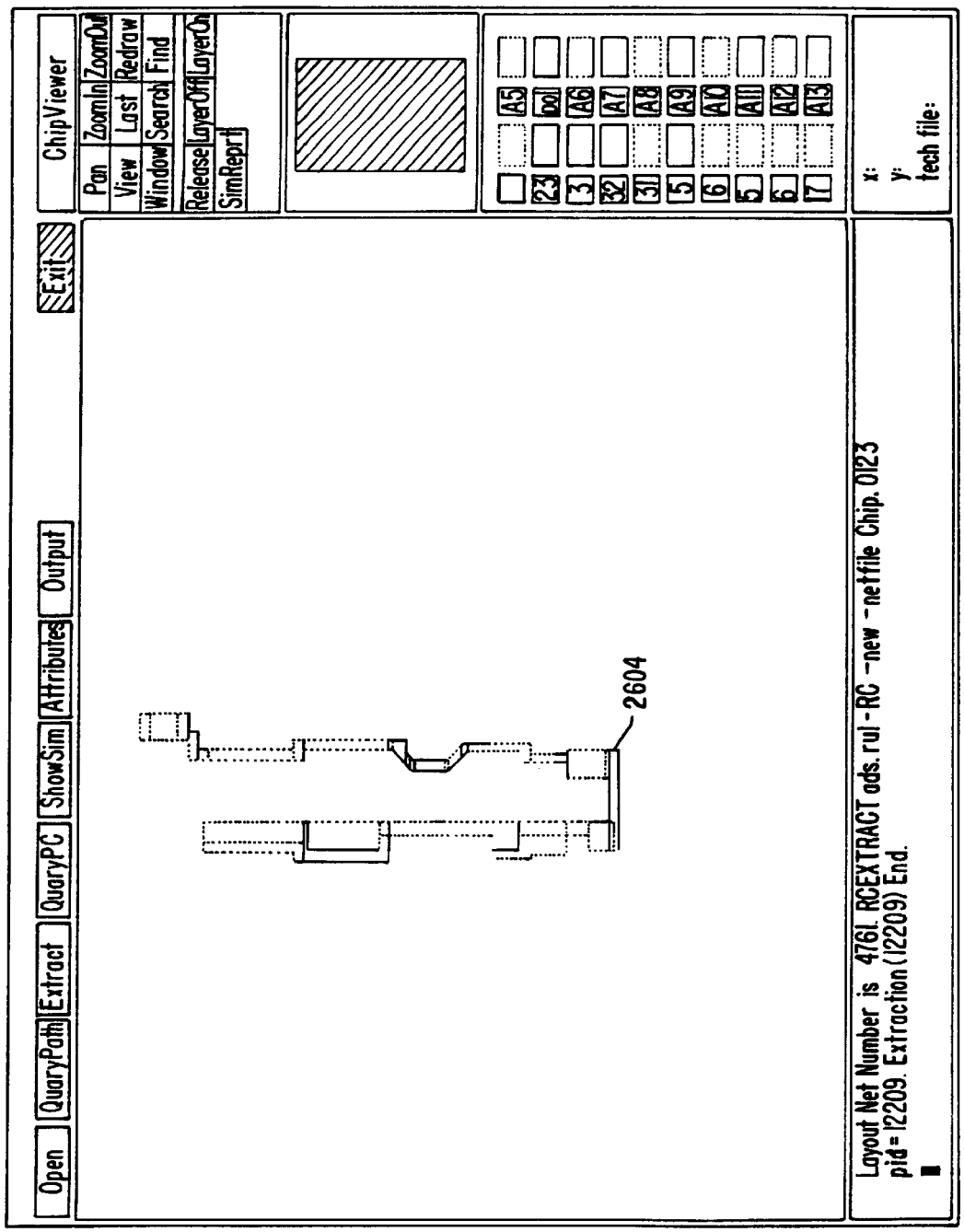
FIG. 26 shows a screen from a chip viewer graphical interface showing a selected net without the surrounding layout.

FIG. 26 shows a screen from a chip viewer 1120 graphical interface showing a selected net without the surrounding layout. Selected net 2604 is the same net as selected net 2504 of FIG. 25. In this embodiment, chip viewer 1120 can display selected net 2604 without the surrounding layout.

Figure 27:
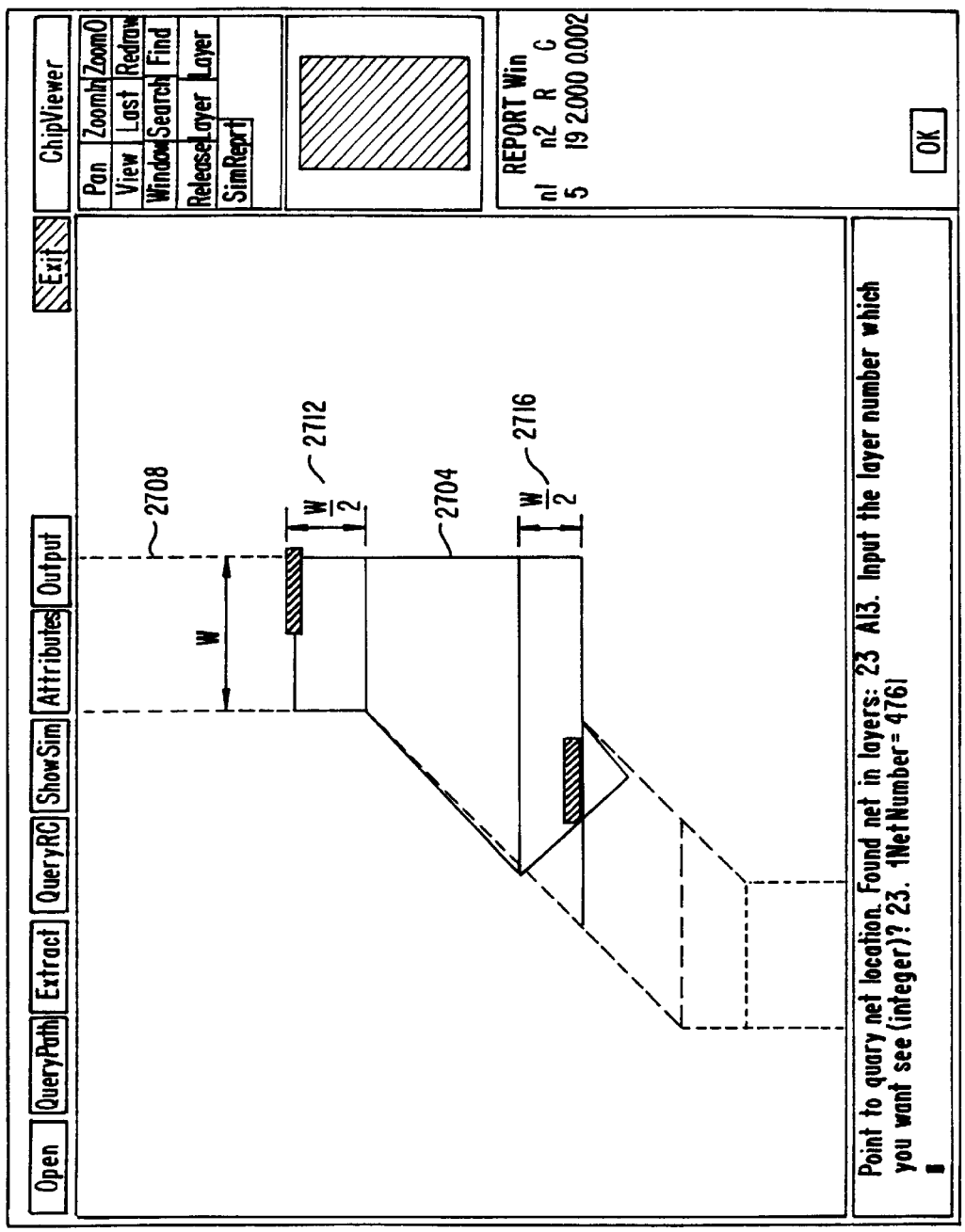
FIG. 27 shows a screen from a chip viewer graphical interface showing the selection of a highly irregular portion of a net.

FIG. 27 shows a screen from a chip viewer 1120 graphical interface showing the selection of an irregular polygon portion 2704 of net 2708. Furthermore, FIG. 27 shows how polygon decomposition 1316 of FIG. 13 breaks up an irregular polygon net to properly account for equipotential lines of current. This allows more accurate extraction of parasitic resistance data. First, the present invention determines the width (W) of net 2708. Then, the present invention breaks up irregular polygon 2704 at breakpoints 2712 and 2716, extending a distance W/2 in opposite directions from the irregular polygon. In the end, the decomposed polygon includes irregular polygon 2704 and two W/2 portions, 2712 and 2716. When extracted, this decomposed polygon will properly account for equipotential lines of current.

Figure 28:
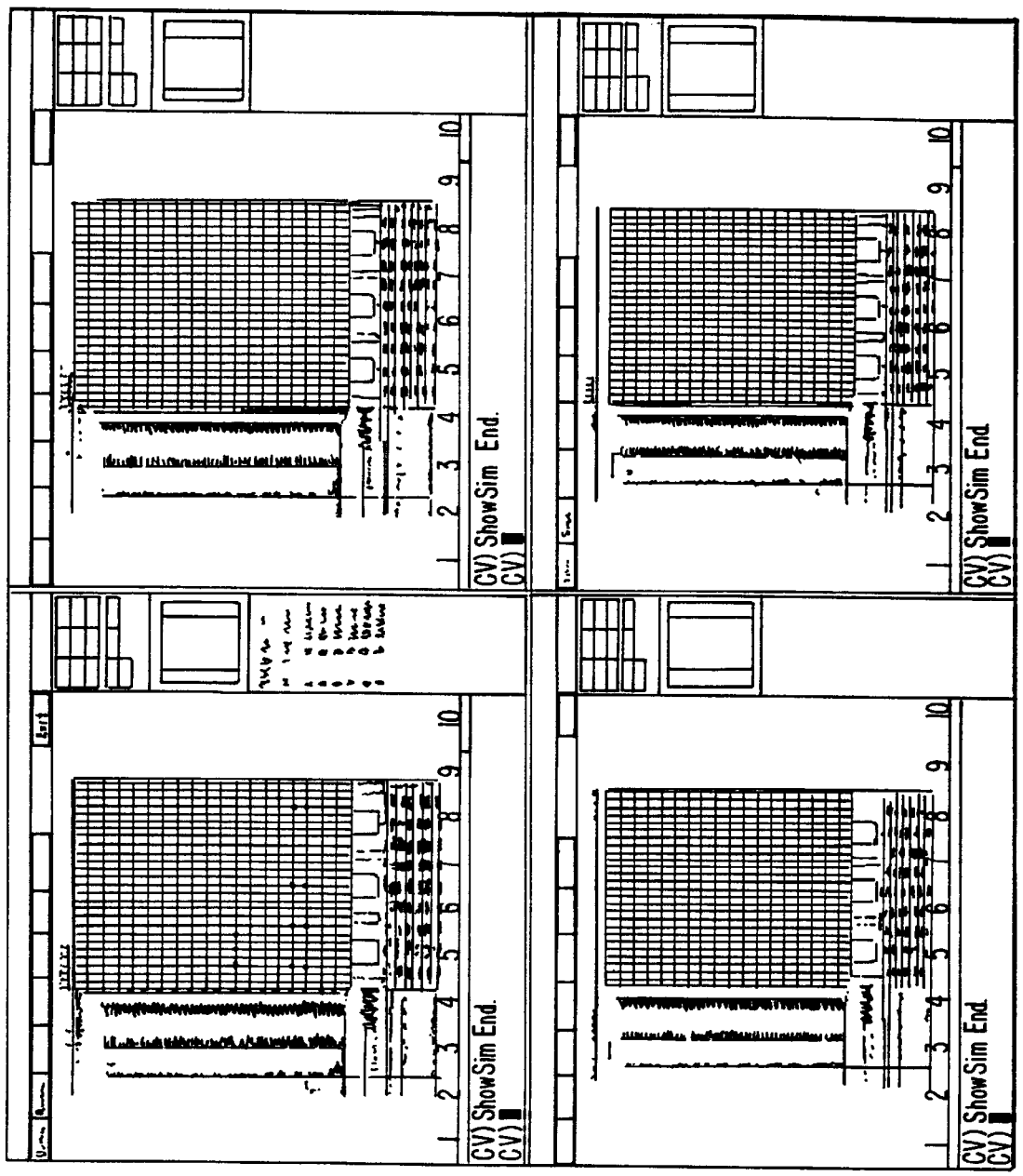
FIG. 28 shows four screens from software analyzing power distribution for an integrated circuit using the netlister output of the present invention.

FIG. 28 shows four screens from software analyzing power distribution for an integrated circuit using output from netlister 1336 of FIG. 13 of the present invention. The screens in FIG. 28 show a power distribution simulation, which is useful in determining which nets and interconnects on an integrated circuit have an unusually high current density, which may lead to an electromigration problem.

Figure 29:
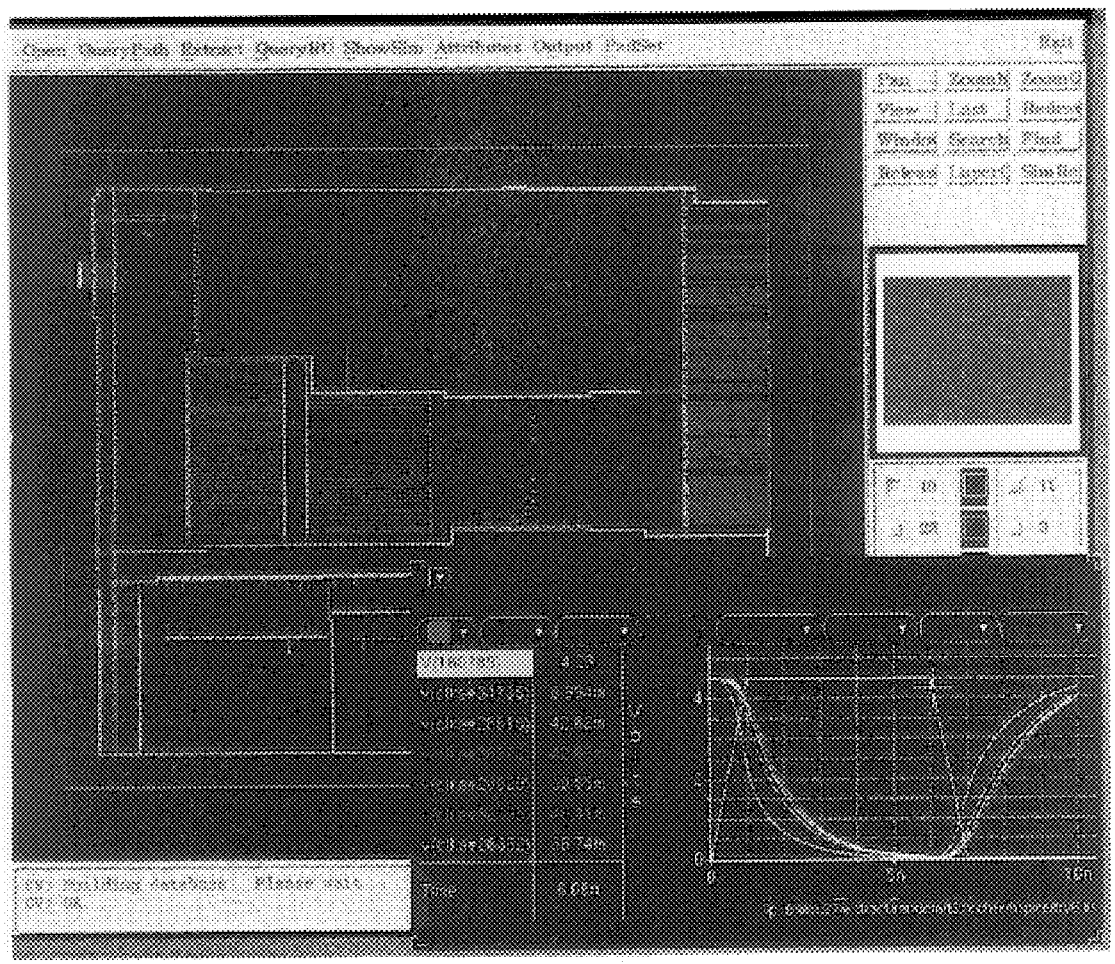
FIG. 29 shows a color screen from chip viewer of clock signal analysis of the present invention.

FIG. 29 shows a color screen from chip viewer 1120 of a clock signal analysis of the present invention. FIG. 29 shows how timing analysis is performed for an integrated circuit, after taking into account the layout parasitics on a clock net. The layout parasitics for the clock net were back annotated into the circuit schematic to allow circuit simulation.

Figure 30:
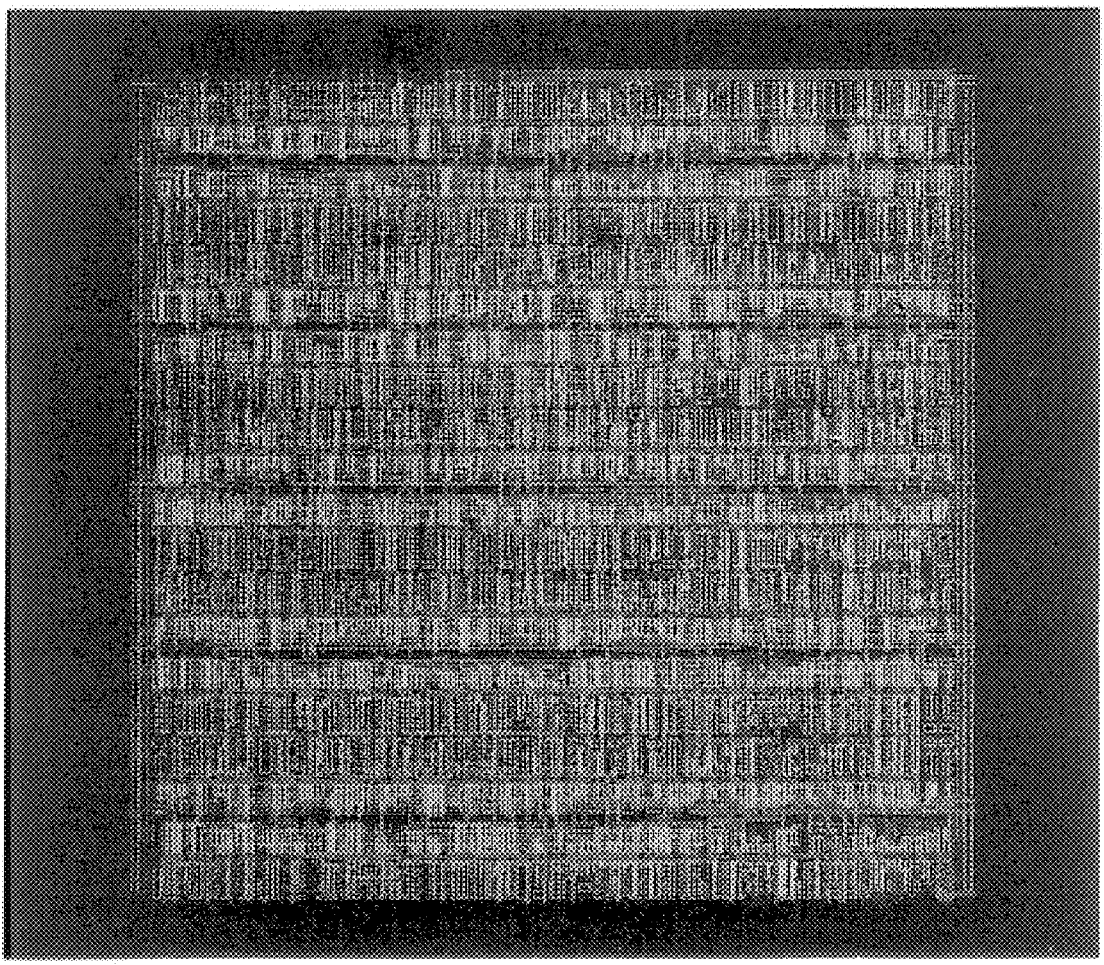
FIG. 30 shows a color screen from chip viewer of a place and route block of the present invention.

FIG. 30 shows a color screen from chip viewer 1120 of a place and route block of the present invention. FIG. 30 shows how chip viewer 1120 highlights a selected net (shown in magenta) that is routed through many blocks of an integrated circuit.

Figure 31:
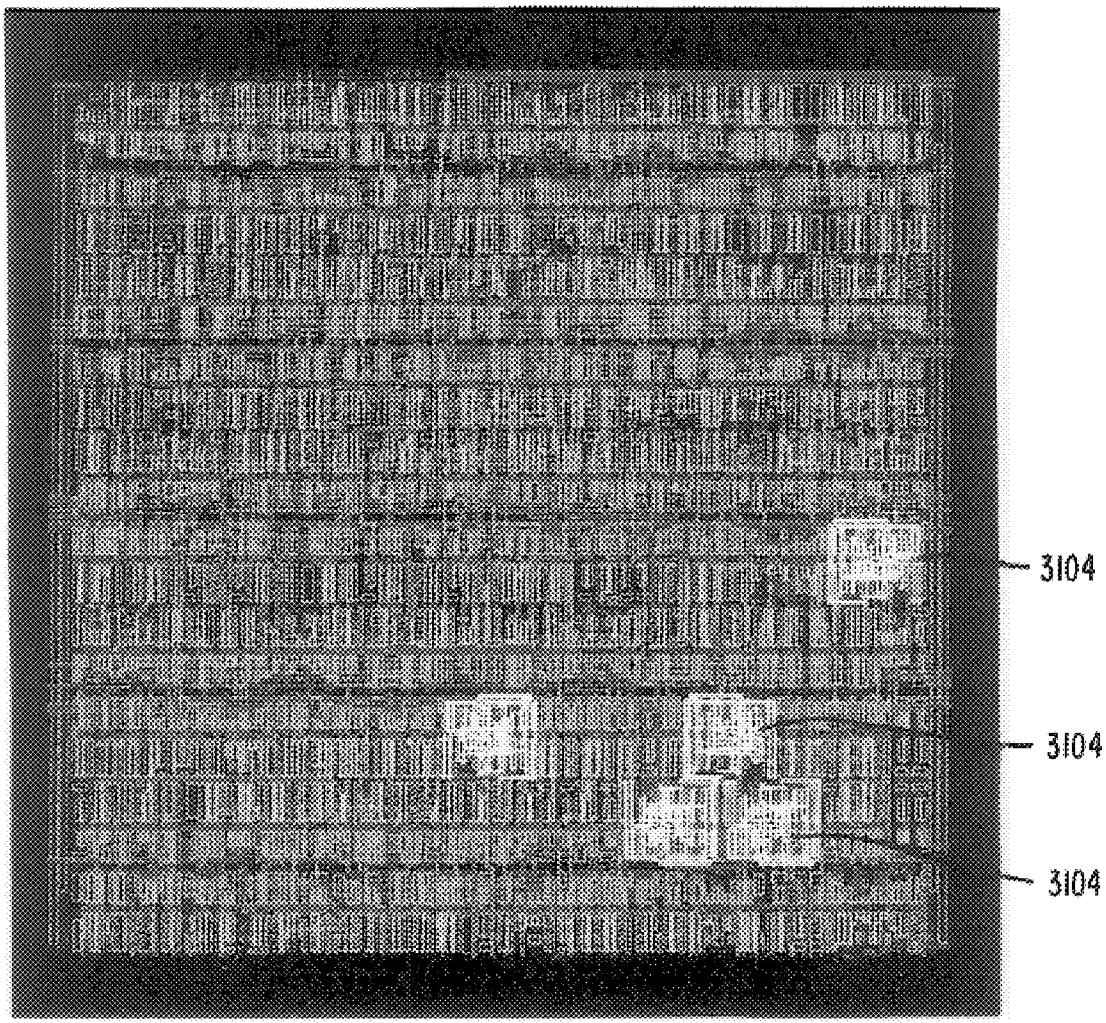
FIG. 31 shows a color screen from chip viewer of hierarchical block extraction of the present invention.

FIG. 31 shows a color screen from chip viewer 1120 of hierarchical block extraction of the present invention. FIG. 31 shows how chip viewer 1120 highlights (shown in white) a selected net 3104 that is routed through blocks of an integrated circuit. Further, net 3104 is contained on a hierarchical block. When a hierarchical block is selected (shown in white), all other similar blocks on the integrated circuit are selected (shown in white).

Figure 32:
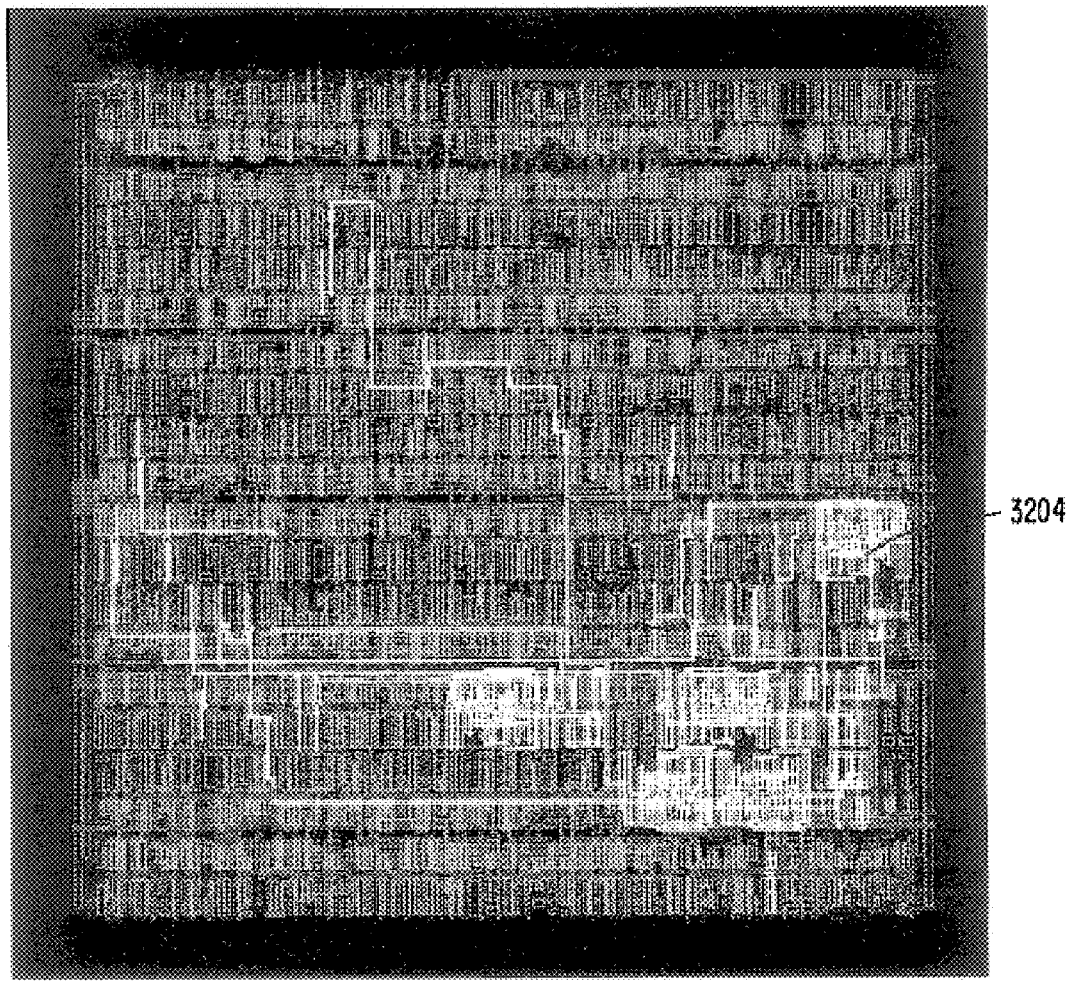
FIG. 32 shows a color screen from chip viewer of a hierarchical block and interconnect extraction.

FIG. 32 shows a color screen from chip viewer 1120 of a hierarchical block and interconnect extraction. FIG. 32 shows how chip viewer 1120 highlights (shown in white) a selected net 3204 that is routed through hierarchical blocks and other blocks of an integrated circuit. The present invention can extract layout parasitics for selected net 3204.

Figure 33:
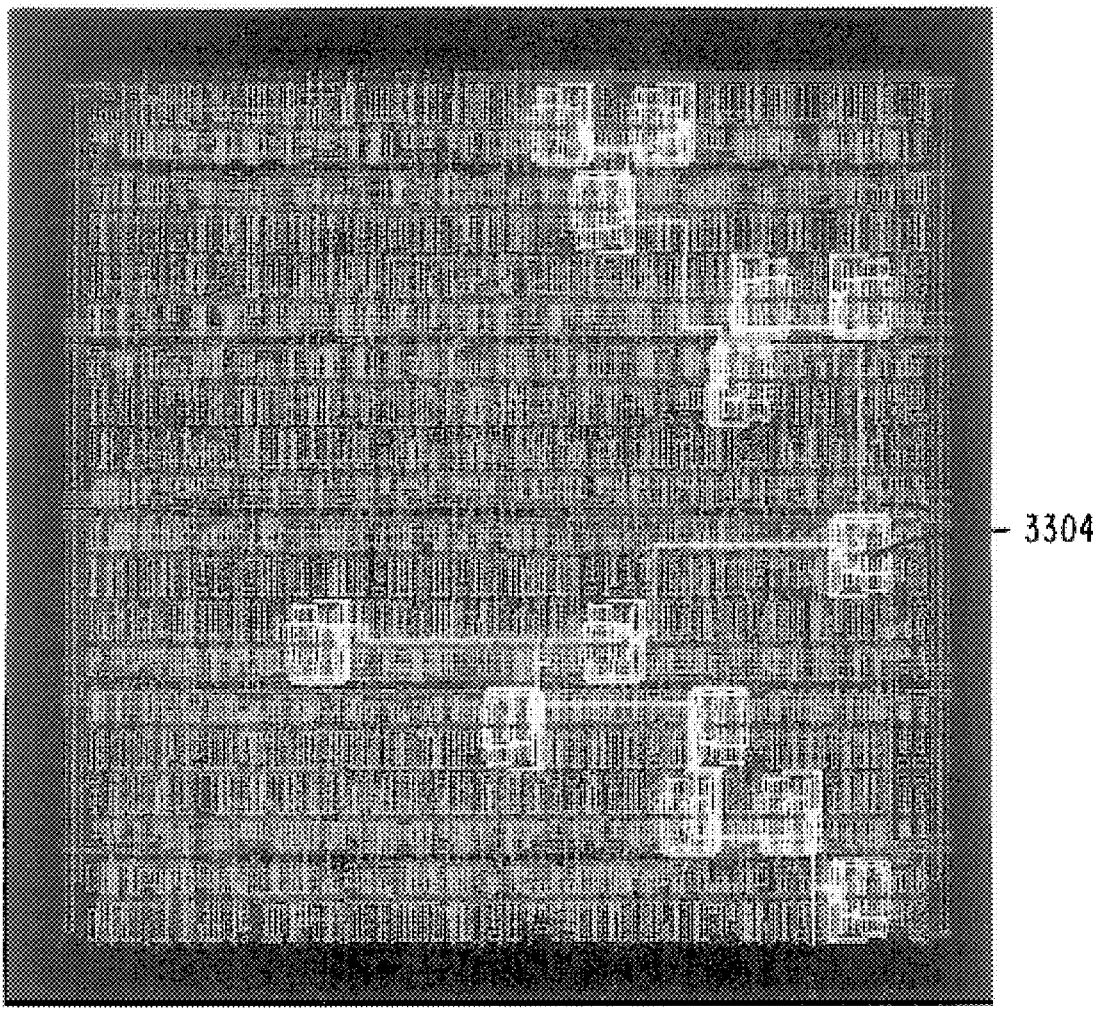
FIG. 33 shows a color screen from chip viewer of a clock tree extraction.

FIG. 33 shows a color screen from chip viewer 1120 of a clock tree extraction. FIG. 33 shows how chip viewer 1120 highlights (shown in white) a selected net 3304 that is routed through blocks of an integrated circuit. Net 3304 is a clock net. The present invention can perform a layout parasitics extraction on the clock tree of net 3304.

The foregoing description of preferred embodiments of the invention has been presented for the purposes of illustration and description. It is not intended to be exhaustive or to limit the invention to the precise form described,. and many modifications and variations are possible in light of the teachings above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the following claims.

What is claimed is:

1. A method of designing an integrated circuit comprising:
provided a netlist database for a circuit block of an integrated circuit design;
providing a layout database for the circuit block of the integrated circuit design;
generating a connectivity database from the netlist and layout databases, wherein in the connectivity database, geometries from the layout database are organized by corresponding nets from the netlist database; and
using the connectivity database to determine characteristics for at least one net of the integrated circuit design using a net-by-net approach.

2. The method of claim 1 wherein the characteristics include parasitic resistances and capacitances.

3. The method of claim 1 further comprising:
using the characteristics to determine a clock skew between a first clock net and a second clock net.

4. The method of claim 1 further comprising:
using the characteristics to evaluate distribution of power between a first power net and a second power net.

5. The method of claim 1 further comprising:
using the characteristics to identify nets where electromigration is potentially a problem.

6. The method of claim 1 further comprising:
using the characteristics to analyze coupling effects between digital and analog portions of the integrated circuit design.

7. The method of claim 1 further comprising:
using the characteristics to identify a critical path of the integrated circuit.

8. The method of claim 1 further comprising:
using the characteristics to identify a evaluate timing of the nets of the integrated circuit.

9. The method of claim 1 further comprising:
using the characteristics to analyze a signal race condition between a first signal on a first net and a second signal on a second net.

10. The method of claim 1 wherein the characteristics include a parasitic resistance of an irregular polygon, and the parasitic resistance is obtained by:
determining a first parasitic resistance value of the irregular polygon, wherein W is a width of regular polygon in a net including the irregular polygon:
creating a first W/2 polygon extension to the irregular polygon:
creating a second W/2 polygon extension to the irregular polygon;
determining a second parasitic resistance value of the first W/2 polygon extension for the irregular polygon;
determining a third parasitic resistance value of the second W/2 polygon extension for the irregular polygon; and
using the sum of the first, second, and third parasitic values as the parasitic resistance for the irregular polygon.

11. The method of claim 1 wherein the characteristics include a parasitic capacitance for a net, and the parasitic is obtained by:

extracting a first parasitic capacitance value for a first cross-section of the net;

extracting a second parasitic capacitance value for a second cross-section of the net; and calculating a sum of the first and second parasitic capacitance values.

12. The method of claim 1 wherein the netlist database and layout database are generated before the connectivity database.

* * * * *